(12) United States Patent
Ooishi

(10) Patent No.: US 6,728,134 B2
(45) Date of Patent: Apr. 27, 2004

(54) NONVOLATILE SEMICONDUCTOR MEMORY DEVICE HAVING CONTROL CIRCUIT

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/216,729

(22) Filed: Aug. 13, 2002

(65) Prior Publication Data

US 2003/0151946 A1 Aug. 14, 2003

(30) Foreign Application Priority Data

Feb. 14, 2002 (JP) ........................................ 2002-036943

(51) Int. Cl.$^7$ .............................................. G11C 16/04
(52) U.S. Cl. .............................. 365/185.03; 365/185.17; 365/185.18
(58) Field of Search ....................... 365/185.03, 185.17, 365/185.18

(56) References Cited

U.S. PATENT DOCUMENTS 6,011,725 A     1/2000  Eitan
6,026,014 A  *  2/2000  Sato et al. ............. 365/185.03
6,201,707 B1    3/2001  Sota
6,275,419 B1 *  8/2001  Guterman et al. ..... 365/185.18

OTHER PUBLICATIONS

B. Eitan, et al "CAN NROM, A 2–Bit, Trapping Storage NVM Cell, Give A Real Challenge To Floating Gate Cells?" The International Conference on Solid State Devices and Materials, 1999, pp. 1–3.

* cited by examiner

Primary Examiner—Huan Hoang
(74) Attorney, Agent, or Firm—McDermott, Will & Emery

(57) ABSTRACT

If forward write is performed to a nonvolatile memory cell, a switch signal output circuit outputs a switch signal to a plurality of switch circuits. As a result, corresponding potentials are supplied to a plurality of bit lines, respectively. A potential supply circuit supplies a write potential and a ground potential to the corresponding bit lines, respectively. Therefore, this nonvolatile semiconductor memory device can suppress an unnecessary current generated during data write.

18 Claims, 29 Drawing Sheets

NONVOLATILE SEMICONDUCTOR MEMORY DEVICE HAVING CONTROL CIRCUIT

BACKGROUND OF THE INVENTION

1. Field of the Invention

The present invention relates to a nonvolatile semiconductor memory device, and more particularly to a nonvolatile semiconductor memory device including a plurality of memory cells each having two storage regions.

2. Description of the Background Art

Among nonvolatile semiconductor memory devices, attention has been paid to an NROM (Nitride Read Only Memory) type flash EEPROM (to be referred to as "NROM" hereinafter) which is a kind of a flash EEPROM. NROM is described in U.S. Pat. Nos. 6,011,725 and 6,201,737.

FIG. 27 is a circuit diagram showing the configuration of the memory cell array of a conventional nonvolatile semiconductor memory device.

Referring to FIG. 27, the memory cell array includes a plurality of nonvolatile memory cells MC, a plurality of bit lines BL and a plurality of word lines WL.

A plurality of word lines WL and a plurality of bit lines BL are arranged in rows and columns, respectively.

Each nonvolatile memory cell MC is arranged to correspond to the intersection between word line WL and bit line BL. A plurality of nonvolatile memory cells MC arranged in the same row are connected in series and the gates thereof are connected to same word line WL. Each of bit line BL is arranged to pass through the connection point between two adjacent nonvolatile memory cells MC.

Nonvolatile memory cell MC has two storage regions L1 and L2.

Next, data write and read operations for writing and reading data to and from respective storage regions L1 and L2 of nonvolatile memory cell MC will be described.

FIGS. 28A to 28D show the data write and read operations for the two storage regions in a nonvolatile memory cell.

Referring to FIG. 28A, the gate of nonvolatile memory cell MC is connected to a word line WL. In addition, it is assumed that nonvolatile memory cell MC is connected to bit lines BL0 and BL1. Nonvolatile memory cell MC has storage region L1 on bit line BL0 side and, as shown in FIG. 28C, has storage region L2 on bit line BL1 side.

An operation for writing data to storage region L1 will first be described. Referring to FIG. 28A, if data is to be written to storage region L1, the potential of bit line BL0 is kept to be a write potential VCCW and that of bit line BL1 is kept to be a ground potential GND. As a result, a write current Ifw is carried from bit line BL0 to bit line BL1 through nonvolatile memory cell MC. At this moment, data is written to storage region L1. Such a write operation for writing data to storage region L1 in nonvolatile memory cell MC will be referred to as forward write.

Next, an operation for reading data from storage region L1 will be described. Referring to FIG. 28B, if data is to be read from storage region L1, the potential of bit line BL0 is kept to be ground potential GND and that of bit line BL1 is kept to be a read potential VCCR. As a result, a read current Ifr is carried from bit line BL1 to bit line BL0. At this moment, data is read from storage region L1. Such a read operation for reading data from storage region L1 in nonvolatile memory cell MC will be referred to as forward read.

As can be seen from the above, the direction of the current flowing in storage region L1 during the write operation is opposite to that of the current flowing in storage region L1 during the read operation.

A write operation for writing data to storage region L2 will next be described. Referring to FIG. 28C, if data is to be written to storage region L2, the potential of bit line BL0 is kept to be ground potential GND and that of bit line BL1 is kept to be write potential VCCW. As a result, a write current Irw is carried from bit line BL1 to bit line BL0. At this moment, data is written to storage region L2. Such a write operation for writing data to storage region L2 in nonvolatile memory cell MC will be referred to as reverse write.

Next, an operation for reading data from storage region L2 will be described. Referring to FIG. 28D, if data is to be read from storage region L2, the potential of bit line BL0 is kept to be read potential VCCR and that of bit line BL1 is kept to be ground potential GND. As a result, a read current Irr is carried from bit line BL0 to bit line BL1. At this moment, data is read from storage region L2. Such a read operation for reading data from storage region L2 in nonvolatile memory cell MC will be referred to as reverse read.

As can be seen from the above, the direction of the current flowing in storage region L2 during the write operation is opposite to that of the current flowing in storage region L2 during the read operation. Further, the direction of the current flowing during the write operation when the data is written to storage region L1 is opposite to that of the current when the data is written to storage region L2. Likewise, the direction of the current flowing during the write operation when the data is read from storage region L1 is opposite to that of the current when the data is read from storage region L2.

Consequently, it is important to control the potentials of respective bit lines BL in the write operation for NROM.

FIG. 29 is an explanatory view for the write operation for writing data to the nonvolatile memory cell in the memory cell array shown in FIG. 27.

Referring to FIG. 29, a case where H-level data is written to storage region L1 of a nonvolatile memory cell MC1 shown therein will be described.

A word line WL1 is selected, the potential of bit line BL0 is kept to be write voltage VCCW and that of bit line BL2 is kept to be ground potential GND. As a result, in nonvolatile memory cell MC1, write current Ifw is carried from a node connected to bit line BL1 to a node connected to bit line BL2. As a result, data is written to storage region L1. At this moment, when attention is paid to a nonvolatile memory cell MC0 adjacent nonvolatile memory cell MC1, an unnecessary current I1 is carried to nonvolatile memory cell MC0 if the potential of bit line BL0 is lower than that of bit line BL1. Unnecessary current I1 may possibly not only prevent power saving but also cause the memory cell array to malfunction.

Furthermore, according to the conventional art, data can be written to a memory cell of 1 bit at one time in the nonvolatile semiconductor memory device represented by NROM and throughput is thereby disadvantageously low.

SUMMARY OF THE INVENTION

It is an object of the present invention to provide a nonvolatile semiconductor memory device capable of suppressing a current which unnecessarily occurs during data write. It is another object of the present invention to provide a nonvolatile semiconductor memory device capable of improving throughput.

A nonvolatile semiconductor memory device according to the present invention includes: a plurality of word lines arranged in rows; a plurality of bit lines arranged in columns; a plurality of memory cells arranged in the rows and the columns; and a control circuit. Each of the plurality of memory cells has at least one storage region storing data. The control circuit selects a plurality of arranged continuously bit lines among the plurality of bit lines, and supplies a plurality of predetermined potentials corresponding to the selected plurality of bit lines. The plurality of memory cells arranged in the rows are connected in series and gates thereof are connected to the word line arranged in the row thereof, and each of the plurality of bit lines is connected to the plurality of memory cells arranged in the two adjacent columns.

As a result, even if the adjacent memory cells are connected to a common bit line, data write and read operations for one memory cell can be performed.

A nonvolatile semiconductor memory device according to the present invention includes: a plurality of word lines arranged in rows; a plurality of bit lines arranged in columns; a plurality of memory cells arranged in the rows and the columns; and a write circuit. Each of the plurality of memory cells has at least one storage region storing data. The write circuit writes a plurality of data to a plurality of continuously arranged memory cells among a plurality of memory cells arranged in the same row. The plurality of memory cells arranged in the rows are connected in series, and gates thereof are connected to the word line arranged in the row thereof, and each of the plurality of bit lines is connected to the plurality of memory cells arranged in the two adjacent columns.

As a result, this nonvolatile semiconductor memory device can write data to a plurality of continuously connected memory cells in one write operation. Throughput is thereby improved.

A nonvolatile semiconductor memory device according to the present invention includes: a plurality of word lines arranged in rows; a plurality of bit lines arranged in columns; a plurality of memory cells; and a write circuit. Each of the plurality of memory cells has at lest one storage region storing data and the plurality of memory cells are arranged in the rows and the columns. The write circuit writes a plurality of data to a plurality of continuously arranged memory cells among a plurality of memory cells arranged in the same row. The plurality of memory cells arranged in the rows are connected in series, and gates thereof are connected to the word line arranged in the row thereof, and each of the plurality of bit lines is connected to a plurality of memory cells arranged in the two adjacent columns. Each of the plurality of memory cells stores a plurality of data with not less than three levels.

As a result, the memory cells of this nonvolatile semiconductor memory device can store data of not less than three levels. Besides, this nonvolatile semiconductor memory device can write data to a plurality of memory cells in one write operation. Throughput is thereby improved.

The nonvolatile semiconductor memory device according to the present invention can select a plurality of bit lines and supply different potentials to the respective bit lines. Therefore, an unnecessary current generated during data write is suppressed. In addition, the nonvolatile semiconductor memory device according to the present invention can perform write and read operations to a plurality of memory cells. Throughput can be thereby improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter in detail with reference to the drawings. It is noted that same or corresponding sections are denoted by the same reference symbols, respectively and will not be repeatedly described.

First Embodiment

Figure 1:
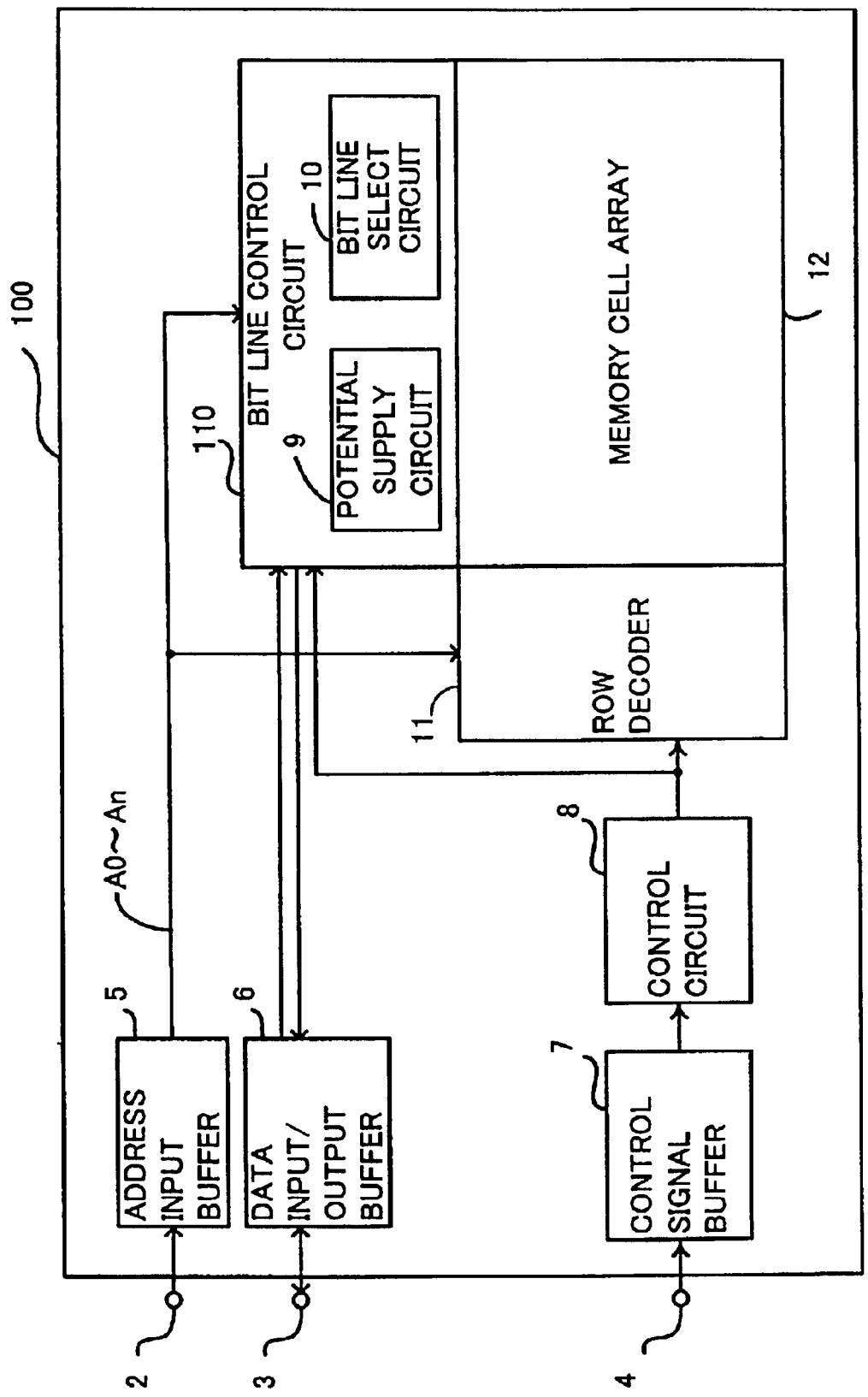
FIG. 1 is a schematic block diagram showing the configuration of a nonvolatile semiconductor memory device in the first embodiment of the present invention.

FIG. 1 is a block diagram showing the configuration of a nonvolatile semiconductor memory device in the first embodiment of the present invention.

Referring to FIG. 1, a nonvolatile semiconductor memory device 100 includes an address signal input terminal 2, a data signal terminal 3, a control signal input terminal 4, an address input buffer 5, a data input/output buffer 6, a control signal buffer 7, a control circuit 8, a potential supply circuit 9, a plural bit line select circuit 10, a row decoder 11 and a memory cell array 12.

Address input buffer 5 receives an external address signal inputted from address signal input terminal 2 and outputs internal address signals A0 to An.

Data input/output buffer 6 transmits and receives data to and from the outside of nonvolatile semiconductor memory device 100 through data signal terminal 3.

Control signal buffer 7 receives an external control signal through control signal input terminal 4 and outputs an internal control signal. Control circuit 8 receives the internal control signal and outputs various signals for controlling the entirety of memory array 12.

Memory cell array 12 includes a plurality of word lines arranged in rows, a plurality of bit lines arranged in columns, and a plurality of nonvolatile memory cells arranged in the rows and columns, respectively. Row decoder 11 and a bit line control circuit 110 are arranged in memory cell array 12.

Row decoder 11 receives internal address signals A0 to An outputted from address input buffer 5, and selects a word line.

Bit line control circuit 110 includes a bit line select circuit 10 and a potential supply circuit 9. Bit line select circuit 10 receives internal address signals A0 to An and selects a plurality of bit lines during a write or read operation.

Potential supply circuit 9 receives internal address signals A0 to An and a data signal DQ, and supplies or stops supplying different predetermined potentials to the plural bit lines selected by bit line select circuit 10, respectively.

Figure 2:
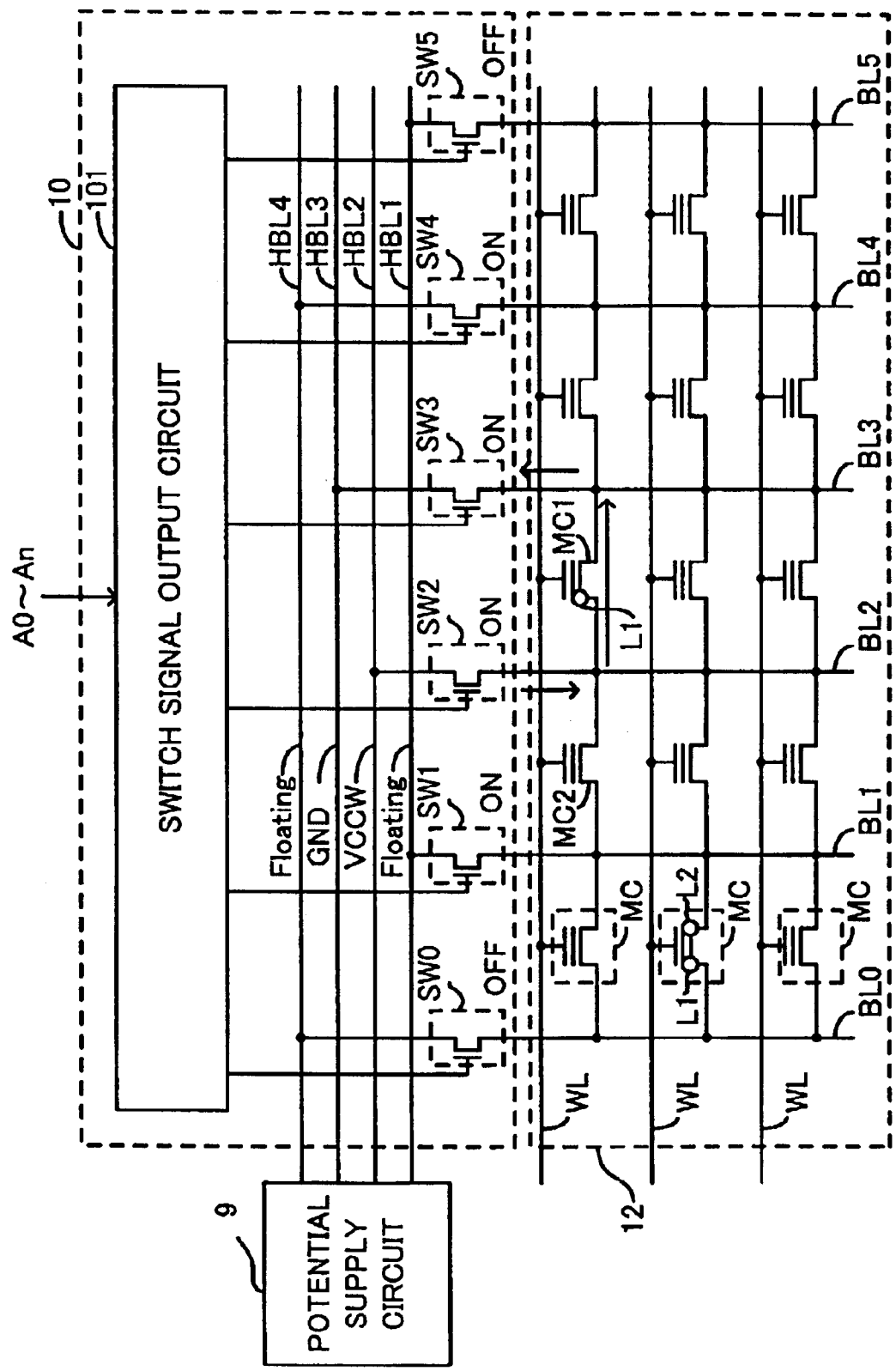
FIG. 2 is a block diagram showing the details of a memory cell array, a bit line select circuit and a potential supply circuit shown in FIG. 1.

FIG. 2 is a block diagram showing the details of the memory cell array, the bit line select circuit and the potential supply circuit shown in FIG. 1.

Referring to FIG. 2, memory cell array 12 includes a plurality of nonvolatile memory cells MC, a plurality of bit lines BL0 to BL5 and a plurality of word lines WL.

Although FIG. 2 shows five bit lines and three word lines, more bit lines and more word lines may be provided.

A plurality of word lines WL and a plurality of bit lines BL are arranged in the rows and columns, respectively.

Each of a plurality of nonvolatile memory cells MC is arranged to correspond to the intersection between word line WL and bit line BL. A plurality of nonvolatile memory cells MC arranged in the same row are connected in series and the gates thereof are connected to same word line WL. Each bit line BL is arranged to pass through the connection point between two adjacent nonvolatile memory cells MC.

Each nonvolatile memory cell MC includes two storage regions L1 and L2.

Potential supply circuit 9 is connected to four hierarchical bit lines HBL1 to HBL4. Hierarchical bit lines HBL1 to HBL4 will be referred to as bit lines HBL1 to HBL4 hereinafter, respectively.

Bit line select circuit 10 includes a switch signal output circuit 101, and a plurality of switch circuit circuits SW0 to SW5 connected to correspond to a plurality of bit lines, respectively. Although FIG. 2 shows five switch circuits, more switch circuits may be provided.

Switch circuit SW0 is connected between bit lines BL0 among a plurality of bit lines BL and HBL4 and the gate thereof is connected to switch signal output circuit 101. Switch circuit SW1 is connected between bit lines BL1 and HBL1 and the gate thereof is connected to switch signal output circuit 101. Switch circuit SW2 is connected between bit lines BL2 and HBL2 and the gate thereof is connected to switch signal output circuit 101. Switch circuit SW3 is connected between bit lines BL3 and HBL3 and the gate thereof is connected to switch signal output circuit 101. Switch circuit SW4 is connected between bit lines BL4 and HBL4 and the gate thereof is connected to switch signal output circuit 101. Switch circuit SW5 is connected between bit lines BL5 and HBL1 and the gate thereof is connected to switch signal output circuit 101.

Switch signal output circuit 101 receives internal address signals A0 to An and outputs a switch signal SWS.

As for the nonvolatile semiconductor memory device having the above-described circuit configuration, an operation for writing data to storage region L1 of nonvolatile memory cell MC1 shown in FIG. 2 will be described.

If data is to be written to storage region L1 of nonvolatile memory cell MC1 shown in FIG. 2, switch signal output circuit 101 outputs switch signal SWS to the gates of switch circuits SW1 to SW4 in accordance with internal address signals A0 to An. At this moment, switch signal output circuit 101 does not output switch signal SWS to switch circuits SW0 and SW5. Switch circuits SW1 to SW4 are, therefore, turned on and switch circuits SW0 and SW5 are,turned off. As a result, bit lines BL1 to BL4 among a plurality of bit lines in memory cell arrays 12 are connected to potential supply circuit 9 through bit lines HBL1 to HBL4, respectively.

Next, potential supply circuit 9 supplies a plurality of potentials corresponding to a plurality of bit lines BL1 to BL4, respectively, connected to potential supply circuit 9. Specifically, potential supply circuit 9 supplies write potential VCCW to bit line HBL2 and ground potential GND to bit line HBL3. In addition, potential supply circuit 9 supplies a floating potential to each of bit lines HBL1 and HBL4.

Consequently, the potential of bit line BL2 is kept to be write potential VCCW and that of bit line BL3 is kept to be ground potential GND. In addition, bit lines BL1 and BL4 turn into a floating state. As a result, data is written to storage region L1 of nonvolatile memory cell MC1. At this moment, since bit line BL1 is in a floating state, the flow of a current from bit line BL2 to nonvolatile memory cell MC2 is suppressed.

Although FIG. 2 shows bit lines BL0 to BL5, more bit lines BL may be arranged. Further, although FIG. 2 shows four bit lines HBL, more or fewer bit lines HBL may be arranged. It is noted, however, that the number of switch circuits SW which are turned on changes according to the number of bit lines HBL.

Figure 3:
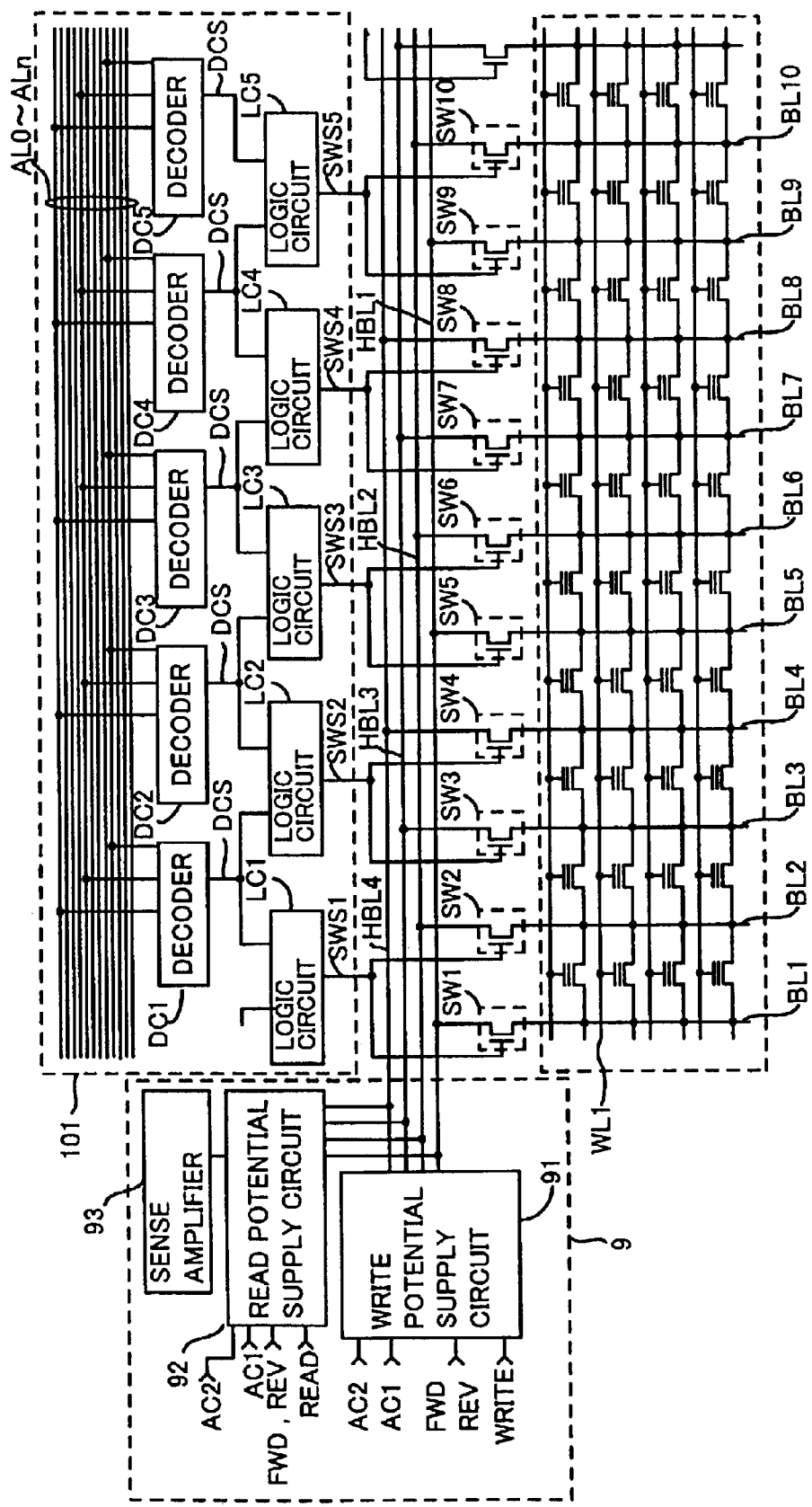
FIG. 3 is a block diagram showing the details of the potential supply circuit and a switch signal output circuit shown in FIG. 2.

FIG. 3 is a block diagram showing the details of the potential supply circuit and the switch signal output circuit shown in FIG. 2.

Referring to FIG. 3, switch signal output circuit 101 includes a plurality of decoders and a plurality of logic circuits.

A decoder DC1 is connected to corresponding plural signal lines among a plurality of address signal lines AL0 to ALn. When corresponding plural address signal lines connected to decoder DC1 receive corresponding internal address signals, respectively, decoder DC1 outputs a decode signal DCS to logic circuits LC1 and LC2. Likewise, when corresponding plural address signal lines connected to a decoder DC2 receive corresponding internal address signals, respectively, decoder DC2 outputs a decode signal DCS to logic circuits LC2 and LC3. A decoder DC3 receives a plurality of predetermined internal address signals and outputs decode signal DCS to logic circuits LC3 and LC4. A decoder DC4 receives a plurality of predetermined internal address signals and outputs decode signal DCS to logic circuits LC4 and LC5. A decoder DC5 receives a plurality of predetermined internal address signals and outputs decode signal DCS to logic circuit LC5 and the other logic circuits which are not shown in FIG. 3.

When receiving decode signal DCS outputted from decoder DC1 or the decoder, not shown, adjacent decoder DC1, logic circuit LC1 outputs switch signal SWS1 to the gate of each of switch circuits SW1 and SW2. When receiving decode signal DCS outputted from decoder DC1 or DC2, logic circuit LC2 outputs switch signal SWS2 to the gate of each of switch circuits SW3 and SW4. When receiving decode signal DCS outputted from decoder DC2 or DC3, logic circuit LC3 outputs switch signal SWS3 to the gate of each of switch circuits SW5 and SW6. When receiving decode signal DCS outputted from decoder DC3 or DC4, logic circuit LC4 outputs switch signal SWS4 to the gate of each of switch circuits SW7 and SW8. When receiving decode signal DCS outputted from decoder DC4 or DC5, logic circuit LC5 outputs switch signal SWS5 to the gate of each of switch circuits SW9 and SW10.

Switch circuits SW1 to SW10 are connected to corresponding bit lines BL1 to BL10, respectively. In addition, switch circuits SW1, SW5 and SW9 are connected to bit line HBL1. Switch circuits SW2, SW6 and SW10 are connected to bit line HBL2. Switch circuits SW3 and SW7 are connected to bit line HBL3. Switch circuits SW4 and SW8 are connected to bit line HBL4. That is, the four switch circuits arranged to the respective four bit lines arranged continuously are connected to different hierarchical bit lines, respectively.

Figure 4:
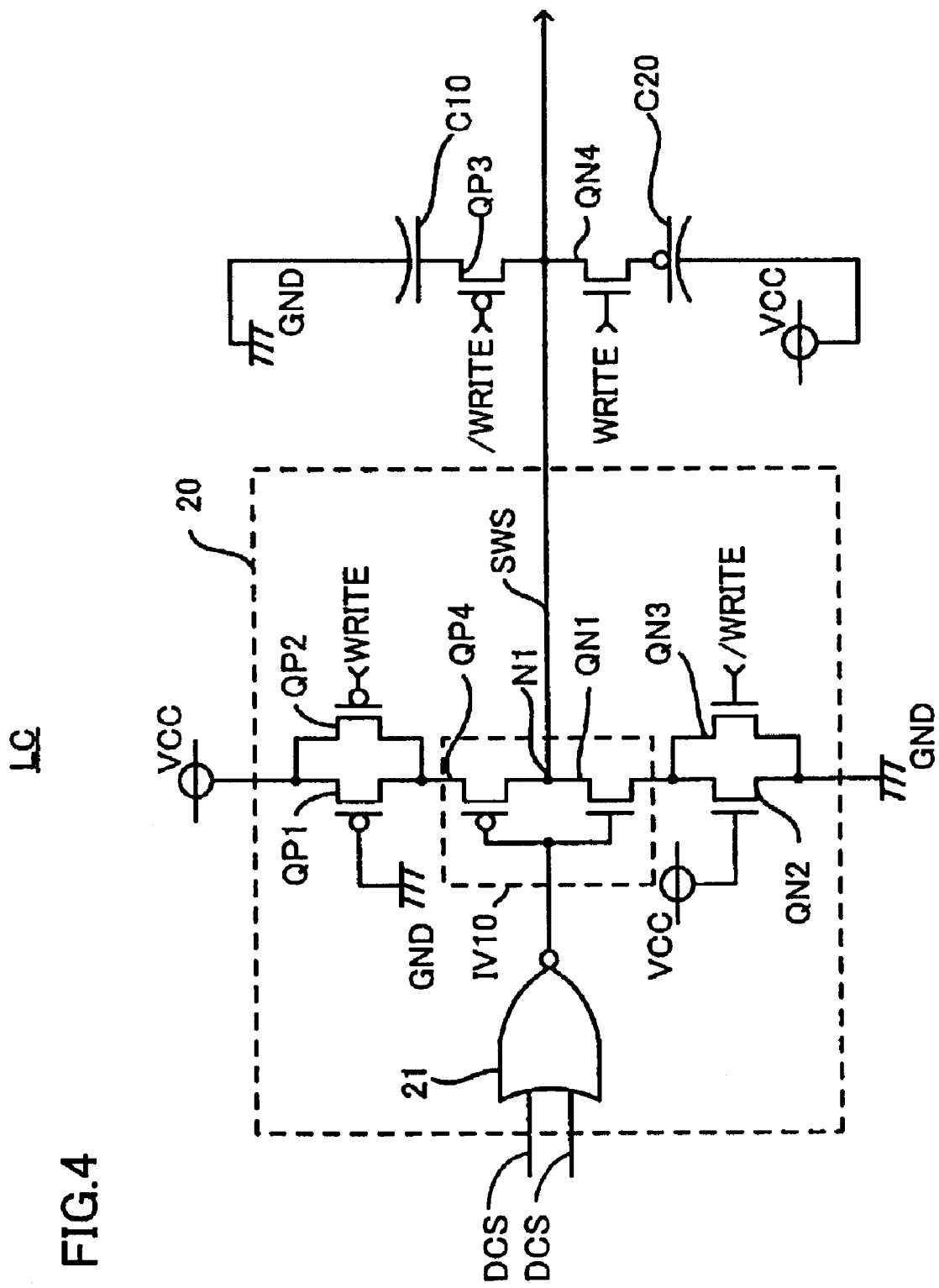
FIG. 4 is a circuit diagram showing the detailed configuration of a logic circuit shown in FIG. 3.

FIG. 4 is a circuit diagram showing the detailed configuration of the logic circuit shown in FIG. 3.

It is noted that all logic circuits LC1 to LC5 shown in FIG. 3 are equal in configuration to a logic circuit LC shown in FIG. 4.

Referring to FIG. 4, logic circuit LC includes a signal generation circuit 20, two capacitance elements C10 and C20, a P-channel MOS transistor QP3 and an N-channel MOS transistor QN4.

Signal generation circuit 20 includes a logic gate 21, an inverter IV10, P-channel MOS transistors QP1 and QP2, and N-channel MOS transistors QN2 and QN3.

Logic gate 21 receives two decode signals DCS transmitted from different decoders DC and outputs an NOR logic operation result. Inverter IV10 includes a P-channel MOS transistor QP4 and an N-channel MOS transistor QN1. Inverter IV10 receives and inverts the output signal of logic gate 21 and outputs the inverted signal from an output node N1 as switch circuit SWS.

Transistor QP1 is connected between an internal power supply node VCC and transistor QP4 and the gate thereof is connected to ground potential node GND. Transistor QP2 is connected between internal power supply potential node VCC and transistor QP4 and the gate thereof receives a write signal WRITE. Write signal WRITE is a signal outputted from control circuit 8 and set at H level during a write operation.

Transistor QN2 is connected between transistor QN1 and ground potential node GND. The gate of transistor QN2 is connected to internal power supply potential node VCC. Transistor QN3 is connected between transistor QN1 and ground potential node GND and the gate thereof receives write signal /WRITE. Write signal /WRITE is a complementary signal to write signal WRITE.

Transistor QP3 is connected between output node N1 and capacitance element C10 and the gate thereof receives write signal /WRITE. Capacitance element C10 is an NMOS capacitance and the source and drain thereof are connected to ground potential node GND.

Transistor QN4 is connected between output node N1 and capacitance element C20 and the gate thereof receives write signal WRITE. Capacitance element C20 is a PMOS capacitance and the source and drain thereof are connected to internal power supply potential VCC.

During a write operation, transistors QP2 and QN3 are turned off. Therefore, transistors QP1 and QN2 function as current limiting elements. Further, during the write operation, transistors QP3 and QN4 are turned on and capacitance elements C10 and C20 are connected to output node 1.

As a result, a slew rate during the write operation decreases.

During a read operation, transistors QP2 and QN3 are turned on and transistors QP1 and QN2 are short-circuited. In addition, transistors QP3 and QN4 are turned off. Therefore, capacitance elements C10 and C20 are disconnected from output node N1.

Referring back to FIG. 3, potential supply circuit 9 includes a write potential supply circuit 91, a read potential supply circuit 92 and a sense amplifier 93.

Write potential supply circuit 91 receives write signal WRITE, a forward signal FWD or a reverse signal REV, data signal DQ, lowest address signal AC1 and second lowest address signal AC2, and supplies different potentials to bit lines HBL1 to HBL4, respectively, during the write operation.

Here, forward signal FWD is a signal for instructing forward write in cooperation with write signal WRITE during the write operation and instructing forward read in cooperation with read signal READ during the read operation. Forward signal FWD is outputted from control circuit 8. Reverse signal REV is a signal for instructing reverse write in cooperation with write signal WRITE during the write operation and instructing reverse read in cooperation with read signal READ during the read operation. Reverse signal REV is outputted from control circuit 8. Lowest address signal AC1 is the lowest address signal among internal address signals A0 to An. Second lowest address signal AC2 is the second lowest address signal among internal address signals A0 to An.

Figure 5:
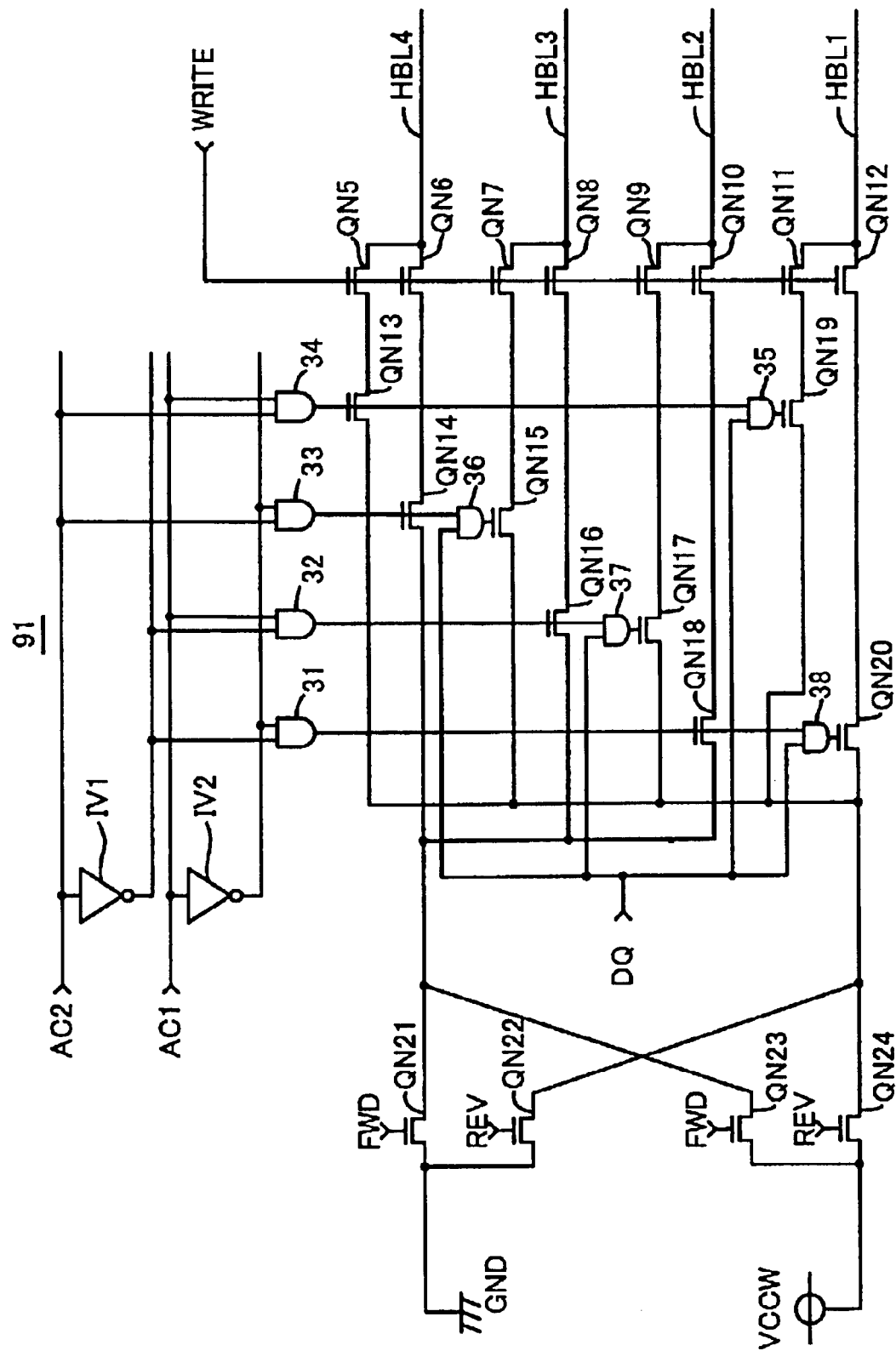
FIG. 5 is a circuit diagram showing the configuration of a write potential supply circuit shown in FIG. 3.

FIG. 5 is a circuit diagram showing the configuration of write potential supply circuit 91 shown in FIG. 3.

Referring to FIG. 5, write potential supply circuit 91 includes inverters IV1 and IV2, logic gates 31 to 38 and N-channel MOS transistors QN5 to QN24.

Inverter IV1 receives and inverts second lowest address signal AC2 and outputs the inverted signal. Inverter IV2 receives and inverts lowest address signal AC1 and outputs the inverted signal. Logic gate 31 receives the output signal of inverter IV1 and that of inverter IV2, and outputs an AND logic operation result. Logic gate 32 receives the output signal of inverter IV1 and lowest address signal AC1, and outputs an AND logic operation result. Logic gate 33 receives second lowest address signal AC2 and the output signal of inverter IV2, and outputs an AND logic operation result. Logic gate 34 receives lowest address signal AC1 and second lowest address signal AC2, and outputs an AND logic operation result.

Logic gate 35 receives the output signal of logic gate 34 and data signal DQ, and outputs an AND logic operation result. Logic gate 36 receives the output signal of logic gate 33 and data signal DQ, and outputs an AND logic operation result. Logic gate 37 receives the output signal of logic gate 32 and data signal DQ, and outputs an AND logic operation result. Logic gate 38 receives the output signal of logic gate 31 and data signal DQ, and outputs an AND logic operation result.

Transistors QN21, QN14 and QN6 are connected in series between ground potential node GND and bit line HBL4. Forward signal FWD is inputted into the gate of transistor QN21. The output signal of logic gate 33 is inputted into the gate of transistor QN14. Write signal WRITE is inputted into the gate of transistor QN6.

Transistors QN16 and QN8 are connected in series between transistor QN21 and bit line HBL3. The output signal of logic circuit 32 is inputted into the gate of transistor QN16. Write signal WRITE is inputted into the gate of transistor QN8. Transistors QN18 and QN10 are connected in series between transistor QN21 and bit line HBL2. The output signal of logic gate 31 is inputted into the gate of transistor QN18. Write signal WRITE is inputted into the gate of transistor QN10.

Transistors QN24, QN20 and QN12 are connected in series between write potential VCCW and bit line HBL1. The gate of transistor QN24 receives reverse signal REV. The gate of transistor QN20 receives the output signal of logic gate 38. The gate of transistor QN12 receives write signal WRITE.

Transistors QN17 and QN9 are connected in series between transistor QN24 and bit line HBL2. The gate of transistor QN17 receives the output signal of logic gate 37. The gate of transistor QN9 receives write signal WRITE. Transistors QN15 and QN7 are connected in series between transistor QN24 and bit line HBL3. The gate of transistor QN15 receives the output signal of logic gate 36. The gate of transistor QN17 receives write signal WRITE. Transistors QN13 and QN5 are connected in series between transistor QN24 and bit line HBL4. The gate of transistor QN13 receives the output signal of logic gate 34. The gate of transistor QN5 receives write signal WRITE.

Transistor QN22 is connected between ground potential node GND and transistor QN20. The gate of transistor QN22 receives reverse signal REV. Transistor QN23 is connected between write potential VCCW node and transistor QN14. The gate of transistor QN23 receives forward signal FWD.

Figure 6:
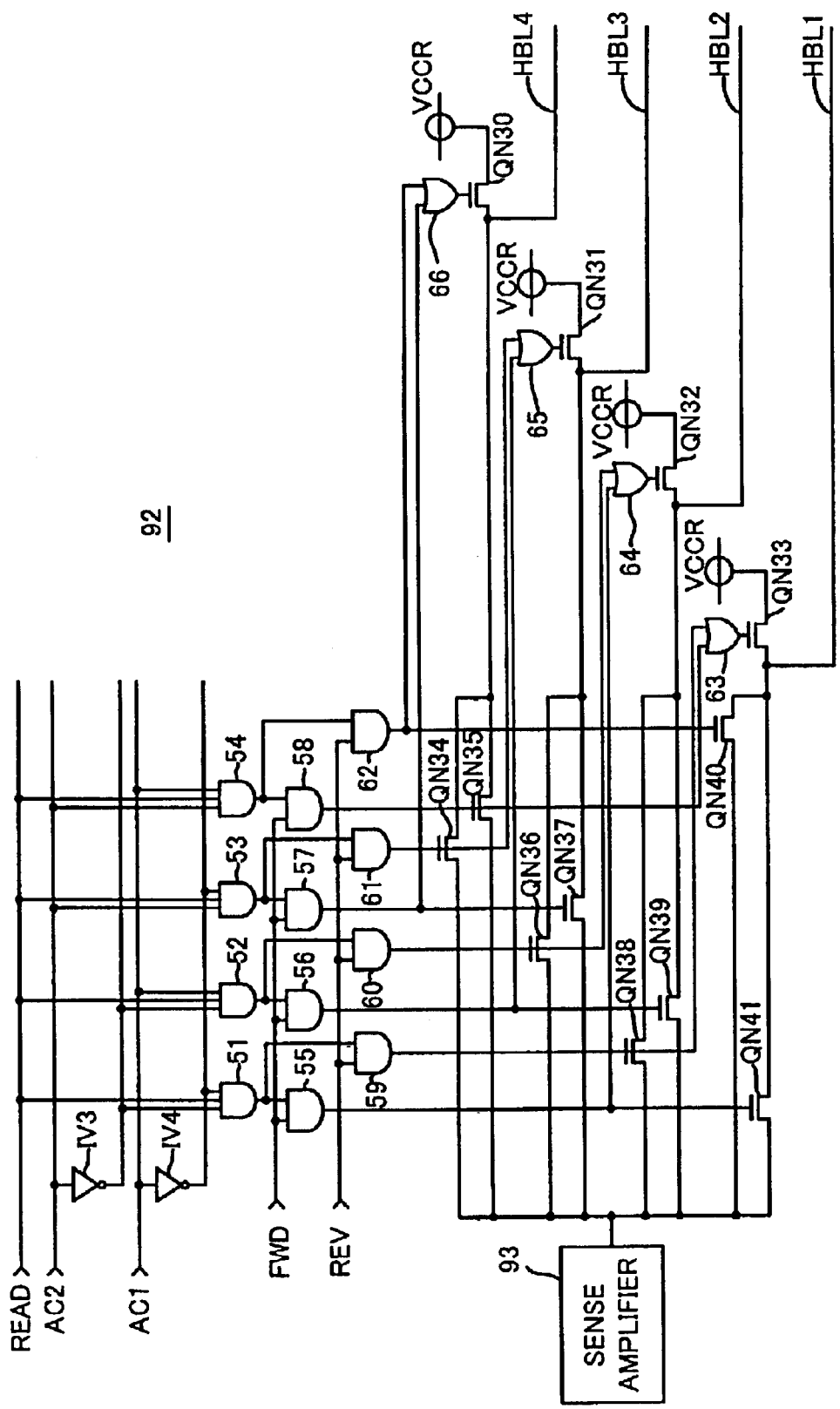
FIG. 6 is a circuit diagram showing the configuration of a read potential supply circuit shown in FIG. 3.

FIG. 6 is a circuit diagram showing the configuration of read potential supply circuit 92 shown in FIG. 3.

Referring to FIG. 6, read potential supply circuit 92 includes inverters IV3 and IV4, logic gates 51 to 66 and N-channel MOS transistors QN30 to QN41.

Inverter IV3 receives and inverts second lowest address AC2 and outputs the inverted signal. Inverter IV4 receives and inverts lowest address AC1 and outputs the inverted signal. Logic gate 51 receives read signal READ, the output signal of inverter IV3 and that of inverter IV4, and outputs an AND logic operation result. Logic gate 52 receives read signal READ, the output signal of inverter IV3 and lowest address signal AC1, and outputs an AND logic operation result. Logic gate 53 receives read signal READ, second lowest address signal AC2 and that of inverter IV4, and outputs an AND logic operation result. Logic gate 54 receives read signal READ, second lowest address signal AC2 and lowest address signal AC1, and outputs an AND logic operation result.

Logic gate 55 receives forward signal FWD and the output signal of logic gate 51, and outputs an AND logic operation result. Logic gate 56 receives forward signal FWD and the output signal of logic gate 52, and outputs an AND logic operation result. Logic gate 57 receives forward signal FWD and the output signal of logic gate 53, and outputs an AND logic operation result. Logic gate 58 receives forward signal FWD and the output signal of logic gate 54, and outputs an AND logic operation result.

Logic gate 59 receives reverse signal REV and the output signal of logic gate 51, and outputs an AND logic operation result. Logic gate 60 receives reverse signal REV and the output signal of logic gate 52, and outputs an AND logic operation result. Logic gate 61 receives reverse signal REV and the output signal of logic gate 53, and outputs an AND logic operation result. Logic gate 62 receives reverse signal REV and the output signal of logic gate 54, and outputs an AND logic operation result.

Logic gate 66 receives the output signal of logic gate 62 and that of logic gate 57, and outputs an OR logic operation result. Logic gate 65 receives the output signal of logic gate 61 and that of logic gate 56, and outputs an OR logic operation result. Logic gate 64 receives the output signal of logic gate 60 and that of logic gate 55, and outputs an OR logic operation result. Logic gate 63 receives the output signal of logic gate 59 and that of logic gate 58, and outputs an OR logic operation result.

Transistors QN30 and QN35 are connected in series between sense amplifier 93 and read,potential node VCCR. Transistor QN30 is connected to read potential node VCCR and transistor QN35 is connected to sense amplifier 93. The gate of transistor QN30 receives the output signal of logic gate 66. The gate of transistor QN35 receives the output signal of logic gate 58. Transistor QN34 is connected between sense amplifier 93 and transistor QN30. The gate of transistor QN34 receives the output signal of logic gate 61. Bit line HBL4 is connected between transistors QN30 and QN35.

Transistors QN31 and QN37 are connected in series between sense amplifier 93 and read potential node VCCR. Transistor QN31 is connected to read potential node VCCR and transistor QN37 is connected to sense amplifier 93. The gate of transistor QN31 receives the output signal of logic gate 65. The gate of transistor QN37 receives the output signal of logic gate 57. Transistor QN36 is connected between sense amplifier 93 and transistor QN31. The gate of transistor QN36 receives the output signal of logic circuit 60. Bit line HBL3 is connected between transistors QN31 and QN37.

Transistors QN32 and QN39 are connected in series between sense amplifier 93 and read potential node VCCR. Transistor QN32 is connected to read potential node VCCR and transistor QN39 is connected to sense amplifier 93. The gate of transistor QN32 receives the output signal of logic gate 64. The gate of transistor QN39 receives the output signal of logic gate 56. Transistor QN38 is connected between sense amplifier 93 and transistor QN32. The gate of transistor QN38 receives the output signal of logic gate 59. Bit line HBL2 is connected between transistors QN32 and QN39.

Transistors QN33 and QN41 are connected in series between sense amplifier 93 and read potential node VCCR. Transistor QN33 is connected to read potential node VCCR and transistor QN41 is connected to sense amplifier 93. The gate of transistor QN33 receives the output signal of logic gate 63. The gate of transistor QN41 receives the output signal of logic gate 55. Transistor QN40 is connected between sense amplifier 93 and transistor QN33. The gate of transistor QN40 receives the output signal of logic gate 62. Bit line HBL1 is connected between transistors QN33 and QN41.

Figure 7:
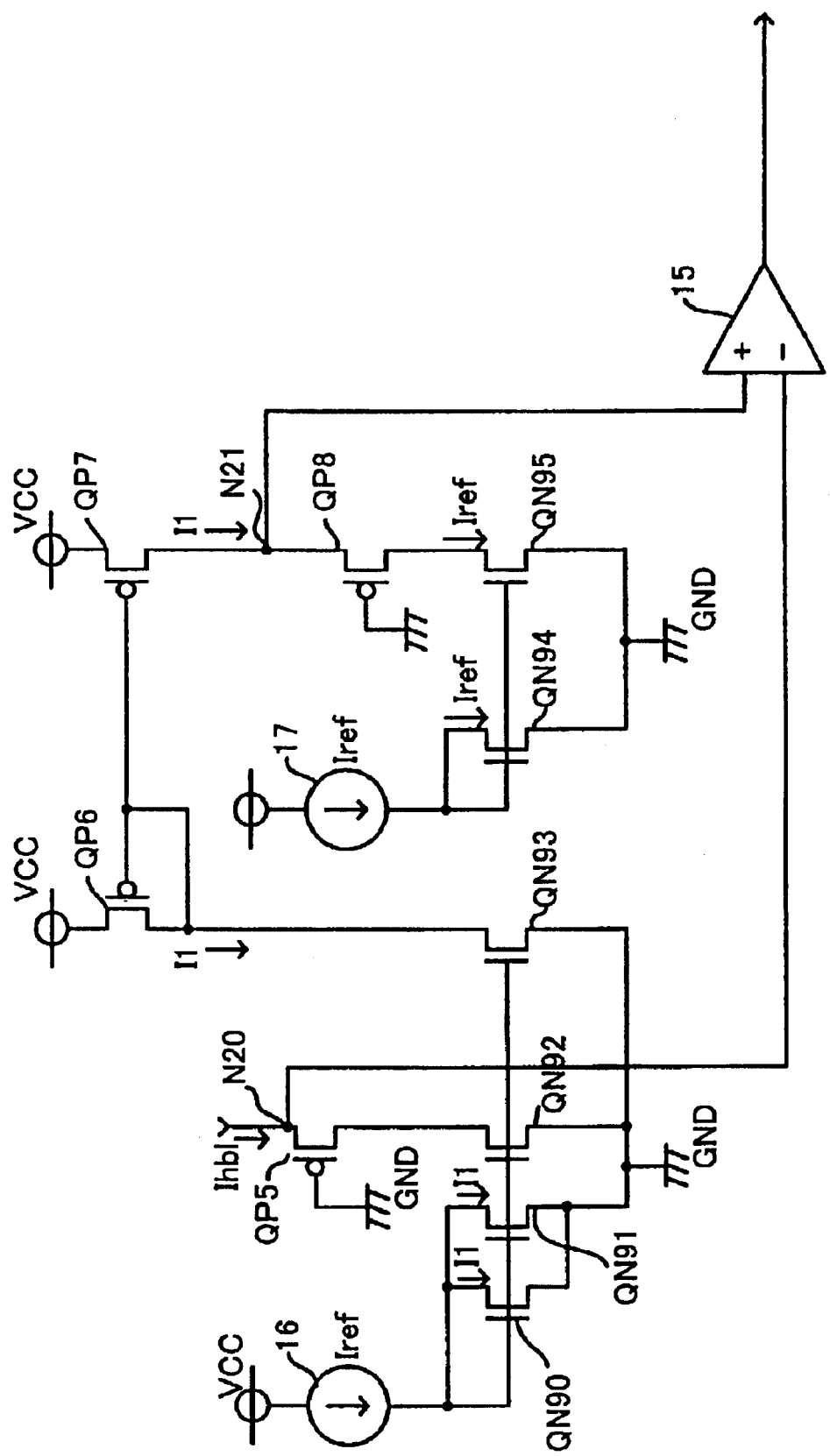
FIG. 7 is a circuit diagram showing the detailed configuration of a sense amplifier.

FIG. 7 is a circuit diagram showing the detailed configuration of sense amplifier 93.

Referring to FIG. 7, sense amplifier 93 includes a comparator 15, constant-current sources 16 and 17, P-channel MOS transistors QP5 to QP8, and N-channel MOS transistors QN90 to QN95.

The gate and drain of each of transistors QN90 and QN91 are both connected to constant-current source 16 and the source thereof is connected to ground potential node GND. Transistors QP5 and QN92 are connected in series. A current Ihb1 from bit line HBL connected to sense amplifier 93 is carried into the source of transistor QP5. In addition, the gate of transistor QP5 is connected to ground potential node GND. The source of transistor QN92 is connected to ground potential node GND. Transistors QN90 and QN91 and transistor QN 92 constitute a current mirror circuit. Transistors QP6 and QN93 are connected in series between internal power supply potential node VCC and ground potential node GND. Transistor QP6 is diode-connected. Further, the gate of transistor QN93 is connected to the gate of transistor QN91. Therefore, transistor QN93 together with transistors QN90 and QN91 constitute a current mirror circuit. Transistors QP7, QP8 and QN95 are connected in series between internal power supply potential node VCC and ground potential node GND. The gate of transistor QP7 is connected to the gate of transistor QP6. Therefore, transistors QP6 and QP7 constitute a current mirror circuit. The gate of transistor QP8 is connected to ground potential node GND.

Transistor QN94 is connected between constant-current source 17 and ground potential node GND and the gate thereof is diode-connected. In addition, the gate of transistor QN94 is connected that of transistor QN95 and transistors QN94 and QN95 constitute a current mirror circuit.

The two input terminals of comparator 15 are connected to output nodes N20 and N21, respectively.

A reference current Iref outputted from constant-current sources 16 and 17 is set to have the quantity of a current carried when the threshold of memory MC is set low. Therefore, current I1 carried to transistor QN92 is Iref/2.

A current Ihb1 carried from selected bit line HBL is compared with current I1. If current Ihb1 is higher than current I1, the potential of output node N20 becomes H level. If current Ihb1 is lower than current I1, the potential of output node 20 becomes L level.

Further, the potential of output node N21 is formed by reference current Iref and current I1.

Comparator 15 compares the potential of output node N20 with that of output node N21.

The write operation of the nonvolatile semiconductor memory device having the above-described circuit configuration will be described.

Figure 8:
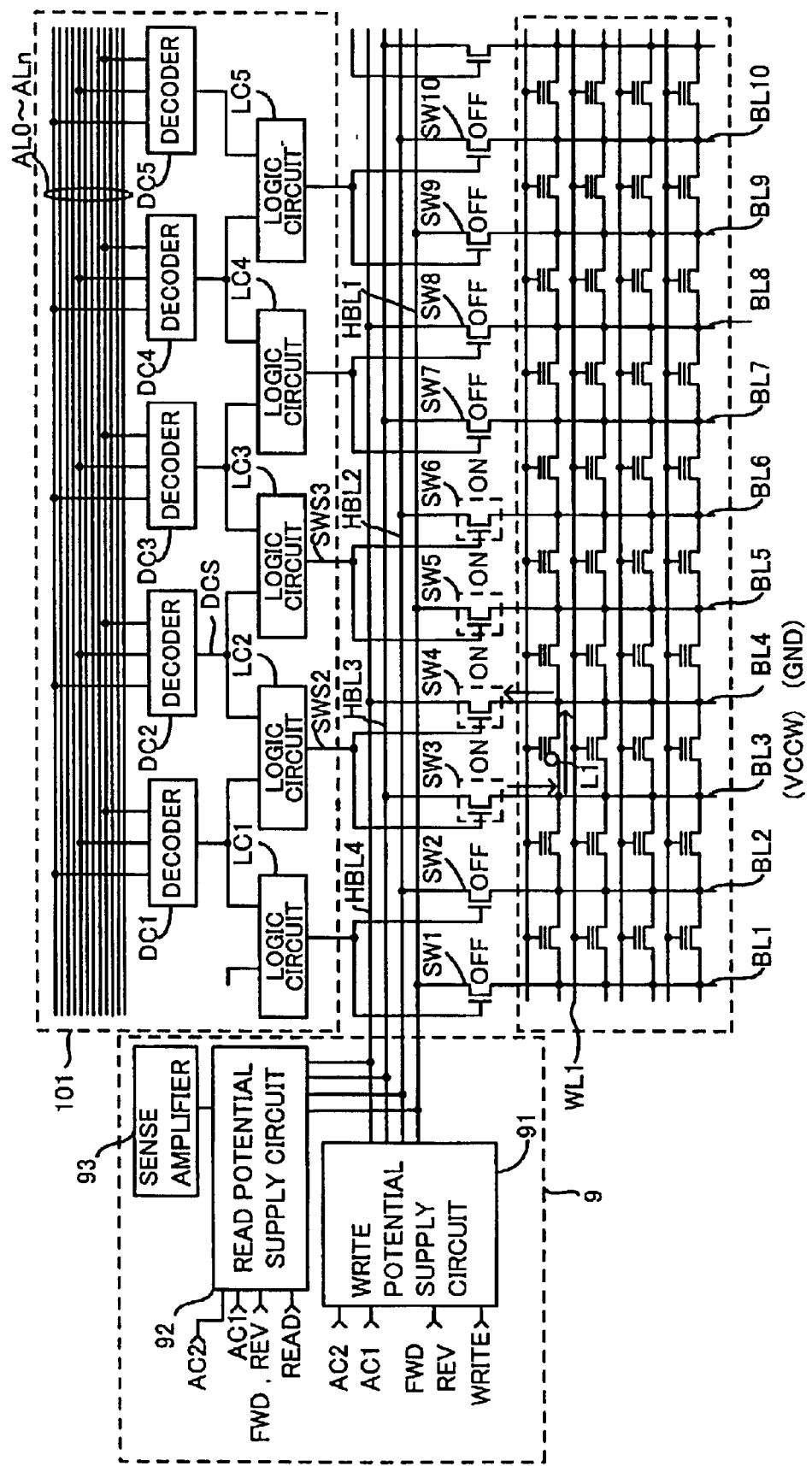
FIG. 8 is an explanatory view for the write operation of a nonvolatile semiconductor memory device in the embodiment of the present invention.

FIG. 8 is an explanatory view for the write operation of the nonvolatile semiconductor memory device in the first embodiment of the present invention.

Referring to FIG. 8, if data is to be written to storage region L1 of memory cell MC1 shown therein, decoder DC2 outputs H-level decode signal DCS in response to address signals A0 to An. Decode signal DCS outputted from decoder DC2 is inputted into logic circuits LC2 and LC3.

Logic circuit LC2 receives decode signal DCS and outputs H-level switch signal SWS2. In addition, logic circuit LC3 receives decode signal DCS and outputs H-level switch signal SWS3.

In response to H-level switch signal SWS2, switch circuits SW3 and SW4 are turned on. As a result, bit line HBL4 is connected to bit line BL4 and bit line HBL3 is connected to bit line BL3. Further, switch circuits SW5 and SW6 are connected to each other in response to H-level switch signal SW3. As a result, bit line HBL1 is connected to bit line BL5 and bit line HBL2 is connected to bit line BL6. Write potential supply circuit 91 determines potentials supplied to respective bit lines HBL1 to HBL4 so that data can be written to storage region L1 of memory cell MC1.

Now, the operation of write potential supply circuit 91 if H-level data is written to storage region L1 of memory cell MC1 (forward write) will be described.

Figure 9:
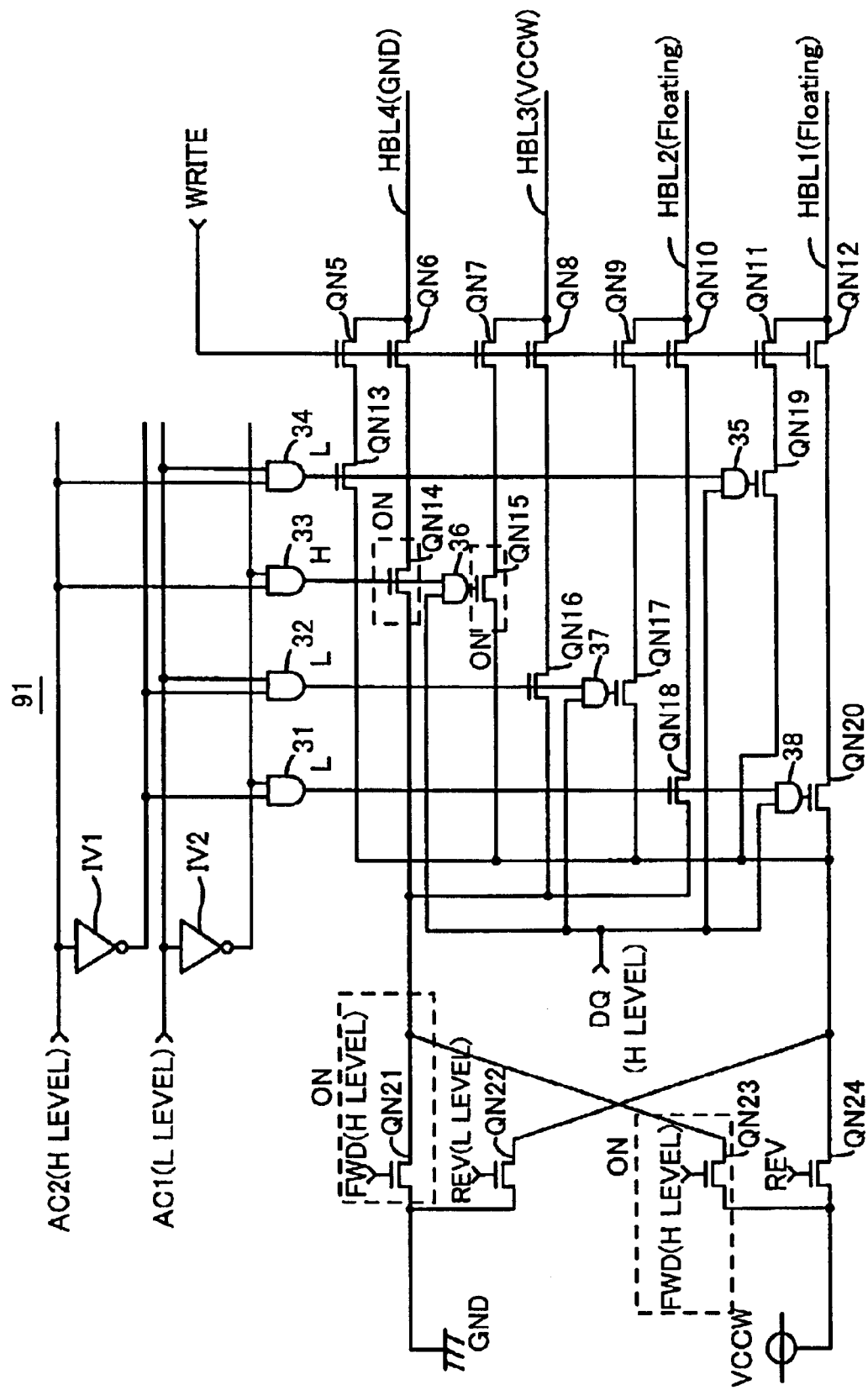
FIG. 9 is an explanatory view for the operation of the write potential supply circuit during a write operation.

FIG. 9 is an explanatory view for the operation of write potential supply circuit 91 during a write operation.

To write data to storage region L1 of memory cell MC1, write potential supply circuit 91 supplies write potential VCCW to bit line HBL3 and ground potential GND to bit line HBL4, respectively, and turns bit lines HBL1 and HBL2 into a floating state.

Referring to FIG. 9, at this moment, second lowest address signal AC2 is at H level and lowest address signal AC1 is at L level. As a result, the output signal of logic gate 33 among those of logic gates 31 to 34 becomes H level. Consequently, transistors QN14 and QN15 among transistors QN14 to QN20 are turned on. In addition, during forward write, since forward signal FWD becomes H level, transistors QN21 and QN23 among transistors QN21 to QN24 are turned on. During the write operation, since write signal WRITE becomes H level, all of transistors QN5 to QN12 are turned on.

As a result of the above, the potential of bit line HBL4 is kept to be ground potential GND and that of bit line HBL3 is kept to be write potential VCCW.

Further, since all transistors QN17 to QN20 are turned off, bit lines HBL1 and HBL2 are turned into a floating gate.

Through the above-described operation, data can be written to storage region L1 of memory cell MC1 during the write operation. If data is written to storage region L2 of memory cell MC1 (reverse write), forward signal FWD shown in FIG. 9 becomes L level and reverse signal REV becomes H level. The potential of bit line HBL4 is kept to be ground potential GND and that of bit line HBL3 is kept to be write potential VCCW. At this moment, bit lines HBL1 and HBL2 are maintained in a floating state.

Next, a case of reading data from storage region L1 of memory cell MC1 will be described.

Figure 10:
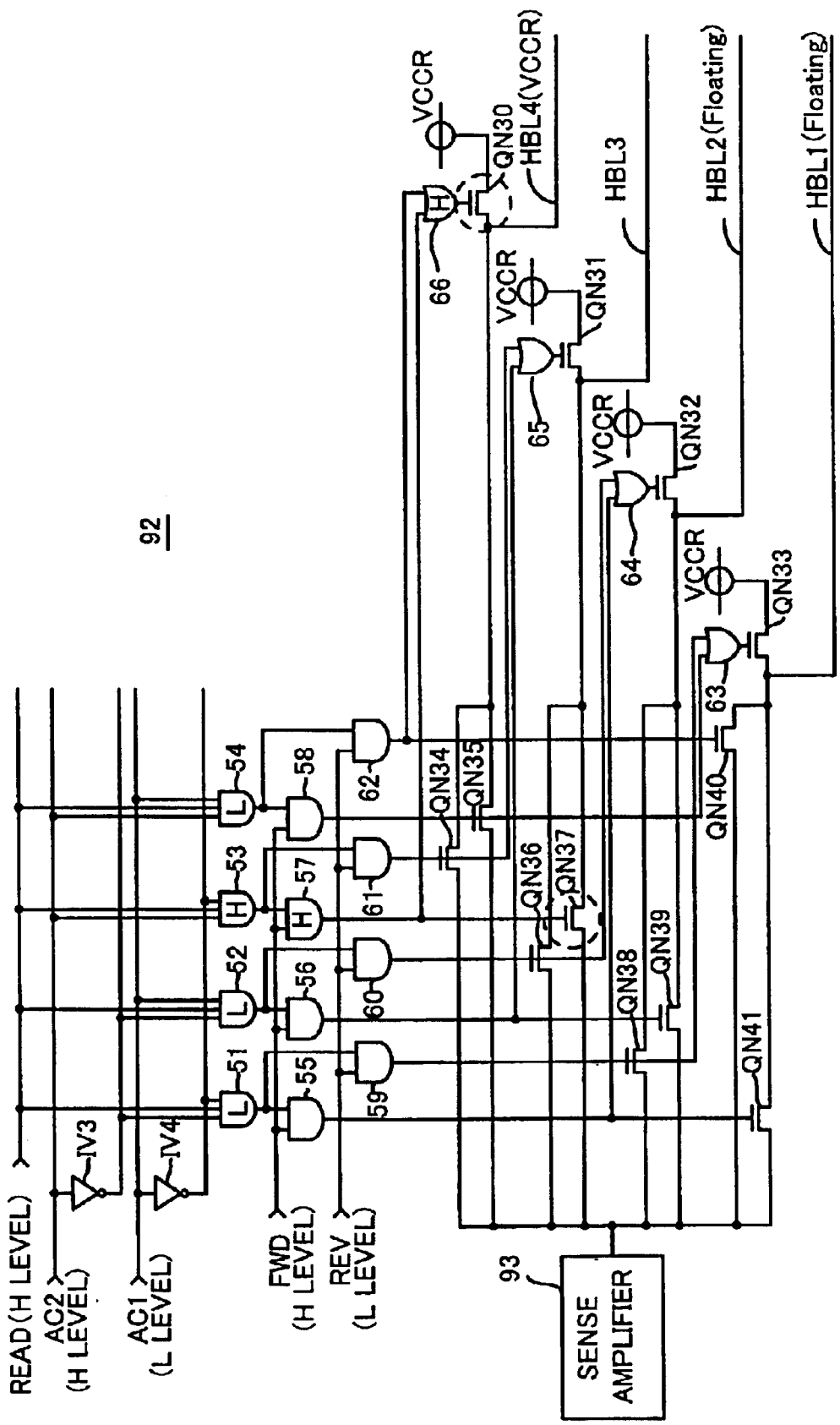
FIG. 10 is an explanatory view for the read operation of the nonvolatile semiconductor memory device in the embodiment of the present invention.

FIG. 10 is an explanatory view for the read operation of the nonvolatile semiconductor memory device in this embodiment.

During a read operation, the operation until bit lines BL3 to BL6 are connected to bit lines HBL3, HBL4, HBL1 and HBL2, respectively is the same as that during the write operation.

Read potential supply circuit 92 determines potentials supplied to respective bit lines HBL1 to HBL4 so that data can be read from storage region L1 of memory cell MC1.

Now, the operation of read potential supply circuit 92 if data is read from storage region L1 of memory cell MC1 will be described.

Referring to FIG. 10, if data is to be read from storage region L1 of memory cell MC1, read signal READ becomes H level. In addition, lowest address signal AC1 becomes L level and second lowest address signal AC2 becomes H level. As a result, the output signal of logic gate 53 becomes H level.

Further, since the read operation for reading data from storage region L1 is forward read, forward signal FWD becomes H level and reverse signal REV becomes L level. As a result, the output signal of logic gate 57 among logic gates 55 to 58 becomes H level. As a result, transistor QN37 among transistors QN34 to QN41 is turned on. Further, since the output signal of logic gate 57 becomes H level, the output signal of logic gate 66 among logic gates 63 to 66 becomes H level. Therefore, transistor QN30 is turned on among transistors QN30 to QN33.

As a result of the above, read potential VCCR is supplied to bit line HBL4, bit line HBL3 is connected to sense amplifier 93 and the potential of bit line HBL3 becomes ground potential GND. In addition, bit lines HBL1 and HBL2 are turned into a floating state.

As a result of the above-described operation, data can be read from storage region L1 of memory cell MC1.

In case of reverse read, forward signal FWD becomes L level and reverse signal REV becomes L level. Therefore, the output signal of logic gate 61 becomes H level. As a result, transistor QN34 is turned on and bit line HBL4 is connected to sense amplifier 93. Further, since the output signal of logic gate 65 becomes H level, the potential of bit line HBL3 is kept to be read potential VCCR.

Through the above-described operation, the nonvolatile semiconductor memory device which includes the nonvolatile memory cells each including the two storage regions can perform write and read operations, by using the bit line select circuit and the potential supply circuit.

Second Embodiment

While the bit line select circuit of the nonvolatile semiconductor memory device in the first embodiment of the present invention selects four bit lines during the write operation or the read operation, the number of bit lines selected by the bit line select circuit can be decreased or increased.

Figure 11:
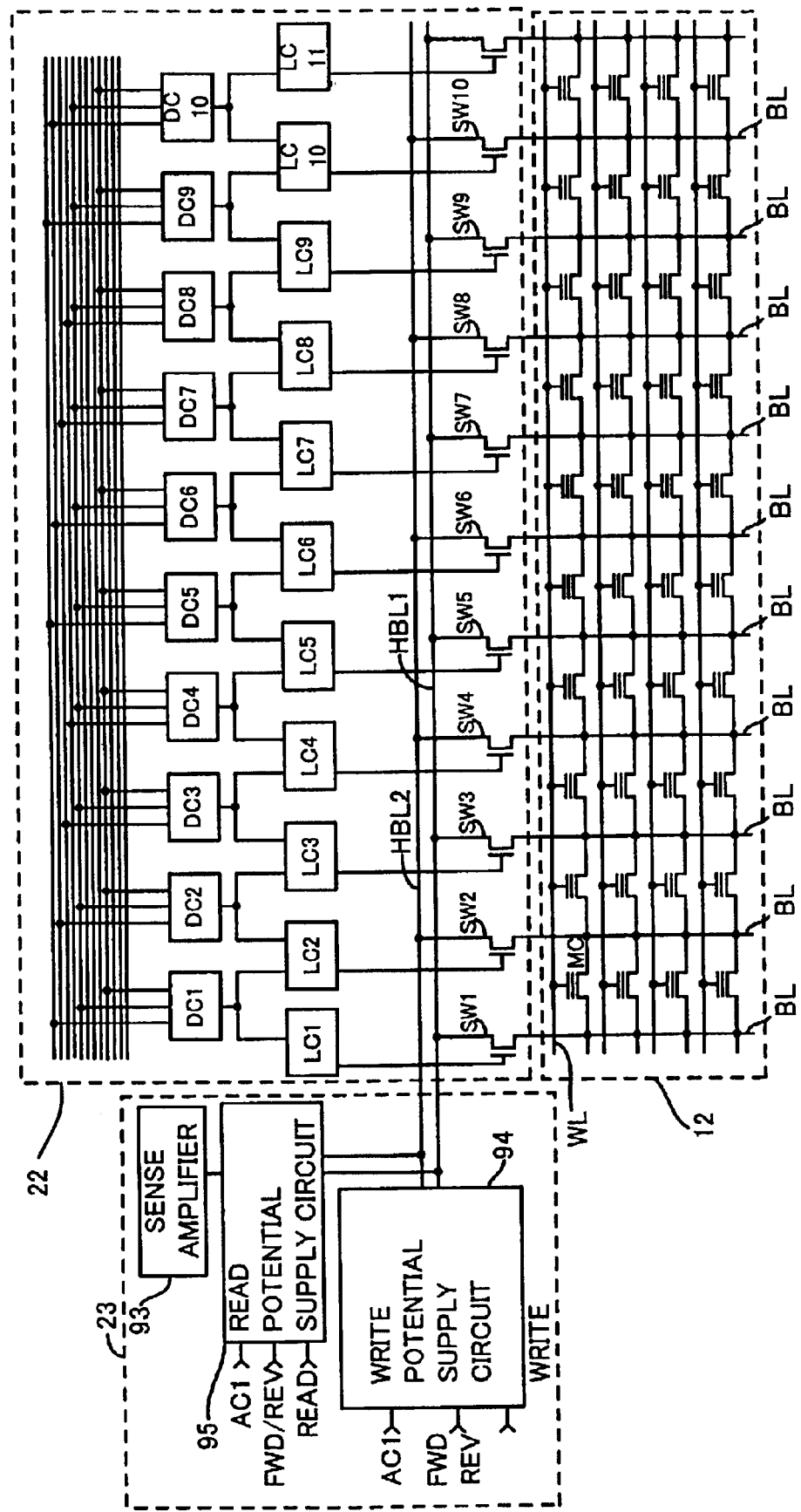
FIG. 11 is a block diagram showing the configurations of a memory cell array, a bit line select circuit and a potential supply circuit of a nonvolatile semiconductor memory device in the second embodiment of the present invention.

FIG. 11 is a block diagram showing the configurations of a memory cell array, a bit line select circuit and a potential supply circuit of a nonvolatile semiconductor memory device in the second embodiment of the present invention.

Referring to FIG. 11, bit line select circuit 22 includes decoders DC1 to DC10, logic circuits LC1 to LC11 and switch circuits SW1 to SW11.

Decoder D1 outputs decode signal DCS to logic circuits LC1 and LC2. Each other decoder Dn (where n is an integer) outputs decode signal DCS to logic circuits LCn and LCn+1.

Logic circuit LC1 outputs switch signal SWS1 to switch circuit SW1. Likewise, each other logic circuit LCn outputs switch signal SWn to switch circuit SWn. Switch circuit SW1 is connected between corresponding bit line BL and bit line HBL1. Likewise, switch signal SWn+1 is connected to bit line HBL1 and switch signal SWn+2 is connected to bit line HBL2.

It is noted that the function of decoder DCn is equal to decoder DCn shown in FIG. 3. In addition, the configuration of logic circuit LCn is equal to that of the logic circuit shown in FIG. 4.

That is, the bit line select circuit in the second embodiment of the present invention selects two bit lines during each of write and read operations.

Potential supply circuit 23 includes write potential supply circuit 94, read potential supply circuit 95 and sense amplifier 93.

Figure 12:
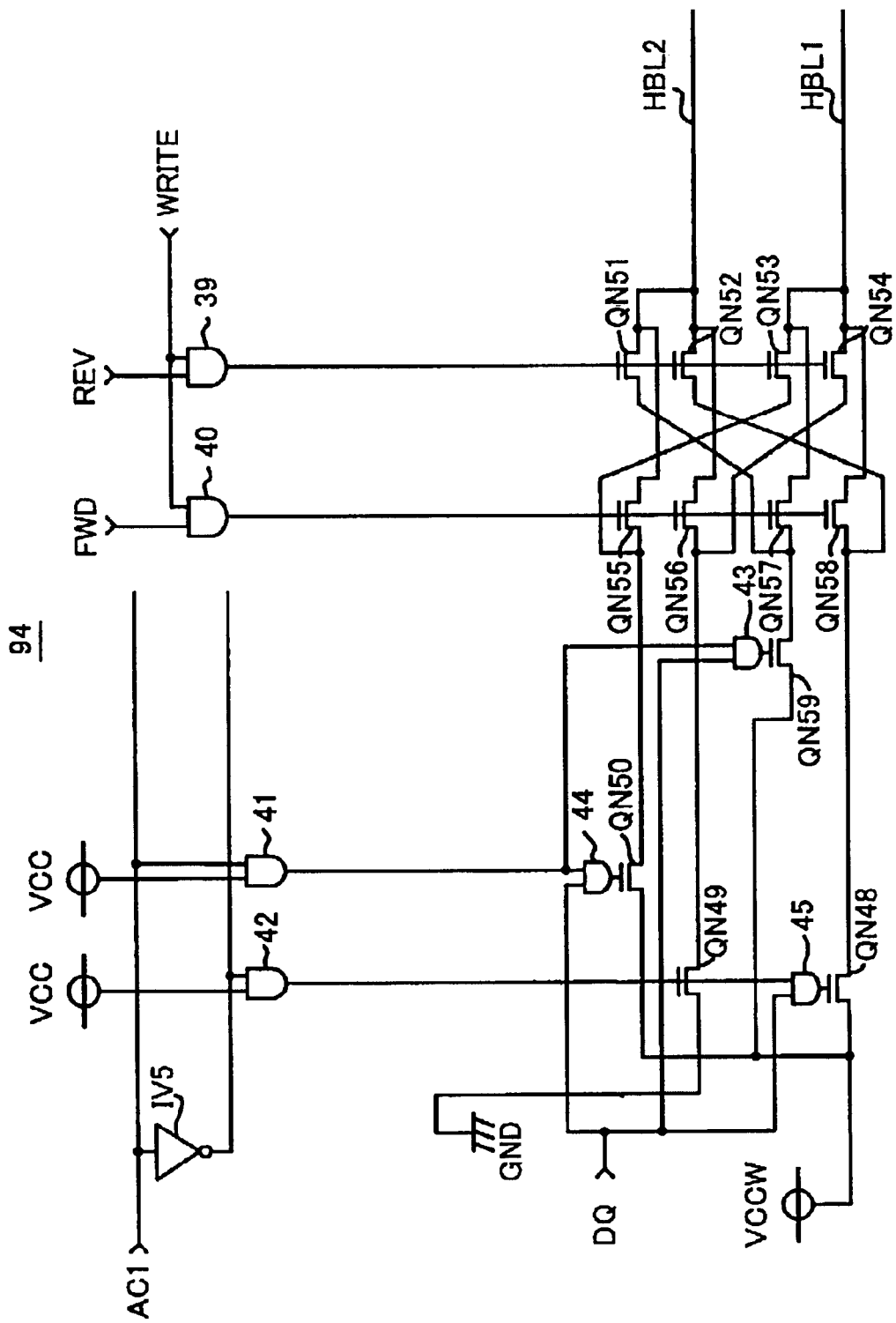
FIG. 12 is a circuit diagram showing the configuration of a write potential supply circuit shown in FIG. 11.

FIG. 12 is a circuit diagram showing the configuration of write potential supply circuit 94 shown in FIG. 11.

Referring to FIG. 12, write potential supply circuit 94 includes an inverter IV5, N-channel MOS transistors QN48 to QN59 and logic gates 39 to 45.

Inverter IV5 inputs and inverts lowest address signal AC1 and outputs the inverted signal. One of the two input terminals of logic gate 42 is connected to internal power supply potential node VCC and the other input terminal thereof is connected to the output terminal of inverter IV5. Logic gate 42 receives the output signal of inverter IV5 and internal power supply potential VCC, and outputs an AND logic operation result. Logic gate 41 receives lowest address signal AC1 and internal power supply potential VCC, and outputs an AND logic operation result.

Logic gate 39 receives write signal WRITE and reverse signal REV, and outputs an AND logic operation result. Logic gate 40 receives write signal WRITE and forward signal FWD, and outputs an AND logic operation result. Each of logic gates 43 and 44 receives the output signal of logic gate 41 and data signal DQ, and outputs an AND logic operation result. Logic gate 45 receives the output signal of logic gate 42 and data signal DQ, and outputs an AND logic operation result.

Transistors QN50 and QN55 are connected in series between write potential node VCCW and bit line HBL2. The gate of transistor QN50 receives the output signal of logic gate 44. The gate of transistor QN55 receives the output signal of logic gate 40. Transistors QN49 and QN56 are connected in series between ground potential node GND and bit line HBL2. The gate of transistor QN49 receives the output signal of logic gate 42. The gate of transistor QN56 receives the output signal of logic gate 40. Transistors QN59 and QN57 are connected in series between write potential node VCCW and bit line HBL1. The gate of transistor QN59 receives the output signal of logic gate 43. The gate of transistor QN57 receives the output signal of logic gate 40. Transistors QN48 and QN58 are connected in series between write potential node VCCW and bit line HBL1. The gate of transistor QN48 receives the output signal of logic gate 45. The gate of transistor QN58 receives the output signal of logic gate 40. Transistor QN51 is connected between transistor QN59 and bit line HBL2. Transistor QN52 is connected between transistor QN48 and bit line HBL2. Transistor QN53 is connected between transistor QN50 and bit line HBL1. Transistor QN54 is connected between transistor QN49 and bit line HBL1. The output signal of logic gate 39 is inputted into the gates of transistors QN51 to QN54.

Next, the operation of write potential supply circuit 94 will be described.

If H-level data is written to storage region L1 out of the two storage regions of memory cell MC (forward write), lowest address signal AC1 becomes L level. Therefore, the output signal of logic gate 41 becomes L level and that of logic gate 42 becomes H level. In addition, since forward signal FWD becomes H level, the output signal of logic gate 40 becomes H level. As a result, transistors QN55 to QN58 are turned on. Further, since data signal DQ is at H level, the output signal of logic gate 45 becomes H level. As a result, transistor QN48 is turned on.

Through the above-described operation, the potential of bit line HBL1 is kept to be write potential VCCW and that of bit line HBL2 is kept to be ground potential GND. As a result, data can be written to storage region L1 of memory cell MC.

If data is written to storage region L2 of memory cell MC (reverse write), forward signal FWD becomes L level and reverse signal REV becomes H level. Therefore, transistors QN55 to QN58 are turned off and transistors QN51 to QN54 are turned on. As a result, the potential of bit line HBL2 is kept to write potential VCCW and that of bit line HBL1 is kept to be ground potential GND.

Through the above-described operation, even if the bit line select circuit selects two bit lines BL during the write and read operations, the write operation for writing data to the two storage regions in a memory cell can be performed.

Figure 13:
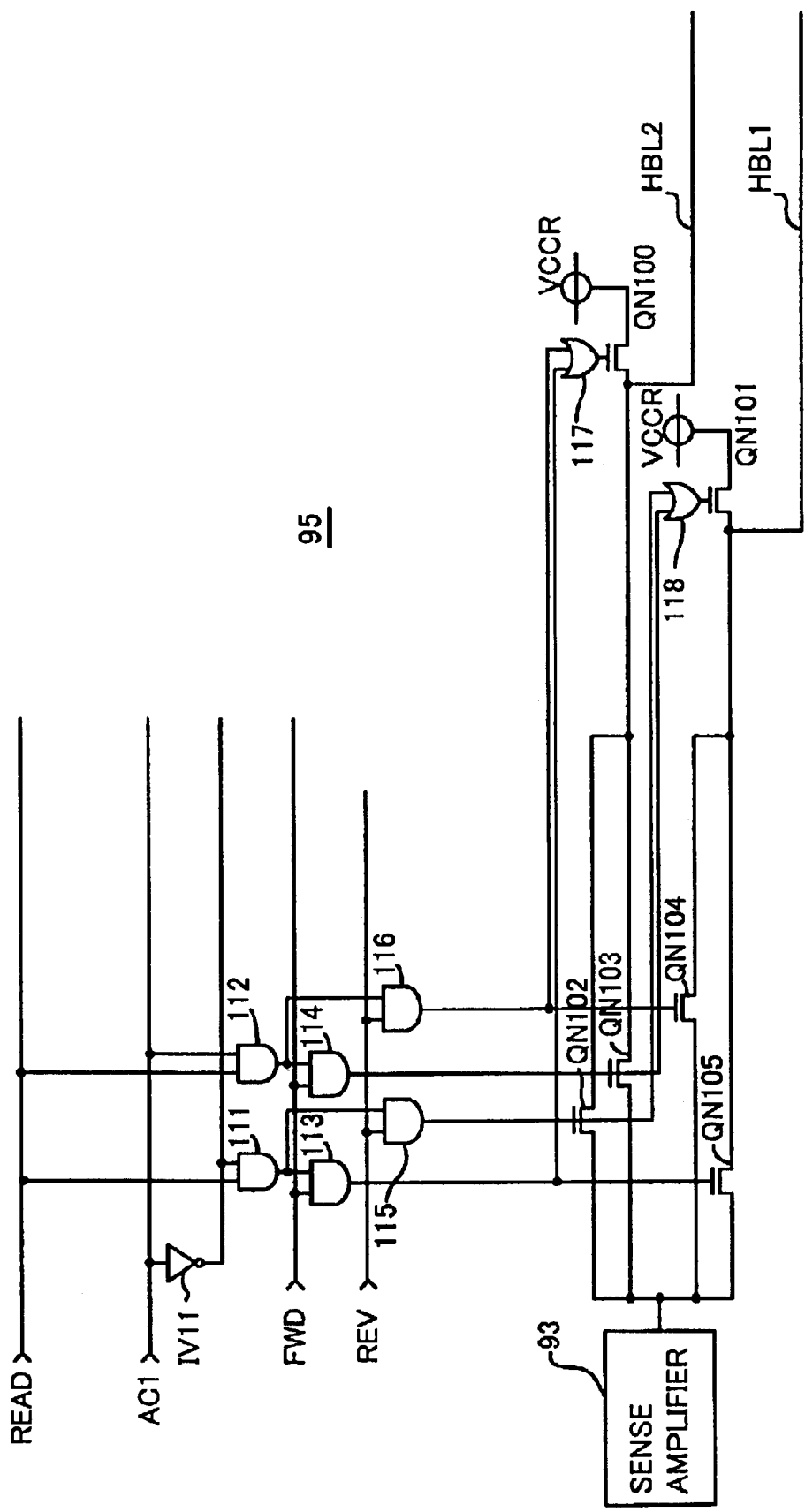
FIG. 13 is a circuit diagram showing the configuration of a read potential supply circuit shown in FIG. 11.

FIG. 13 is a circuit diagram showing the configuration of read potential supply circuit 95 shown in FIG. 11.

Referring to FIG. 13, read potential supply circuit 95 includes an inverter IV11, logic gates 111 to 116, and N-channel MOS transistors QN100 to QN105.

Inverter IV11 receives and inverts lowest address signal AC1 and outputs the inverted signal. Logic gate 111 receives read signal READ and the output signal of inverter IV11, and outputs an AND logic operation result. Logic gate 112 receives read signal READ and lowest address signal AC1, and outputs an AND logic operation result. Logic gate 113 receives forward signal FWD and the output signal of logic gate 111, and outputs an AND logic operation result. Logic gate 114 receives forward signal FWD and the output signal of logic gate 112, and outputs an AND logic operation result. Logic gate 115 receives reverse signal REV and the output signal of logic gate 111, and outputs an AND logic operation result. Logic gate 116 receives reverse signal REV and the output signal of logic gate 112, and outputs an AND logic operation result. Logic gate 117 receives the output signal of logic gate 116 and that of logic gate 114, and outputs an OR logic operation result. Logic gate 118 receives the output signal of logic gate 114 and that of logic gate 115, and outputs an OR logic operation result.

Transistors QN103 and QN100 are connected in series between read potential node VCCR and sense amplifier 93. The gate of transistor QN103 receives the output signal of logic circuit 114. The gate of transistor QN100 receives the output signal of logic circuit 117. Transistor QN102 is connected between sense amplifier 93 and transistor QN100 and the gate thereof receives the output signal of logic gate 115.

Transistors QN105 and QN101 are connected in series between read potential node VCCR and sense amplifier 93. The gate of transistor QN105 receives the output signal of logic circuit 113. The gate of transistor QN101 receives the output signal of logic circuit 118. Transistor QN104 is connected between sense amplifier 93 and transistor QN101 and the gate thereof receives the output signal of logic gate 116.

Bit line HBL2 is connected between transistors QN100 and QN103 and bit line HBL1 is connected between transistors QN101 and QN105.

Next, the operation of read potential supply circuit 95 will be described.

If data is read from storage region L1 out of the two storage regions of memory cell MC (forward read), lowest address signal AC1 becomes L level. Therefore, logic gate 111 becomes H level. In addition, since forward signal FWD becomes H level, the output signal of logic gate 113 becomes H level. As a result, transistor QN is turned on. Further, since the output signal of logic gate 113 becomes H level, the output signal of logic gate 117 also becomes H level. As a result, transistor QN100 is turned on.

Through the above-described operation, the potential of bit line HBL2 is kept to read potential VCCR and bit line HBL1 is connected to sense amplifier 93. As a result, data can be read from storage region L1 of memory cell MC.

If data is read from storage region L2 of memory cell MC (reverse read), forward signal FWL becomes L level and reverse signal REV becomes H level. Therefore, the potential of bit line HBL1 is kept to be read potential VCCR and bit line HBL2 is connected to sense amplifier 93.

Through the above-described operation, even if the bit line select circuit selects two bit lines BL during the write and read operations, the read operation for reading data from the two storage regions in a memory cell can be performed.

Third Embodiment

Figure 14:
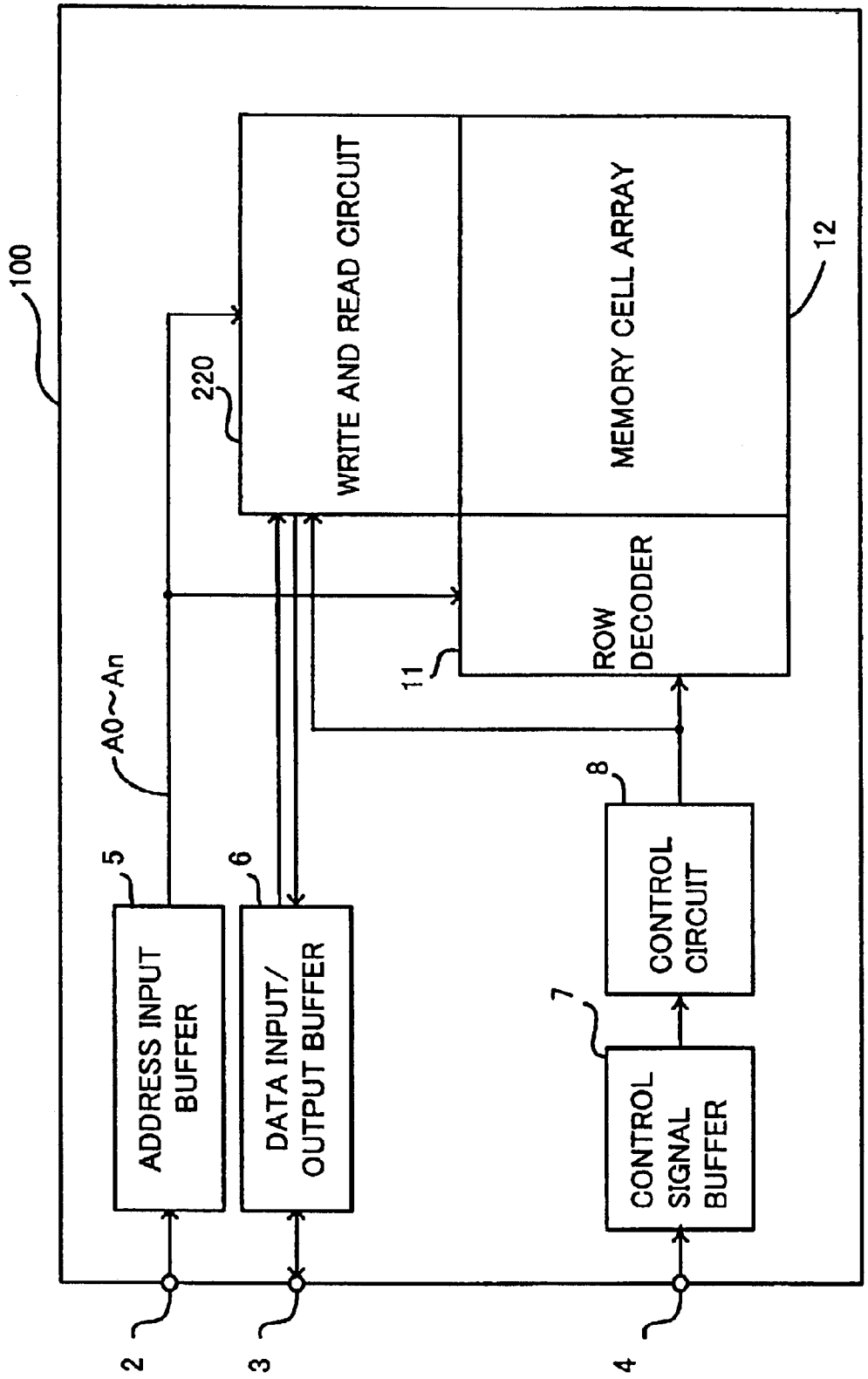
FIG. 14 is a schematic block diagram showing the overall configuration of a nonvolatile semiconductor memory device in the third embodiment of the present invention.

FIG. 14 is a schematic block diagram showing the overall configuration of a nonvolatile semiconductor memory device in the third embodiment of the present invention.

Referring to FIG. 14, nonvolatile semiconductor memory device 100 includes a write and read circuit 220 in place of potential supply circuit 9 and bit line control circuit 110, compared with nonvolatile semiconductor memory device 100 shown in FIG. 1.

Write and read circuit 220 receives internal address signals A0 to An outputted from address input buffer 5, data signal DQ outputted from data input/output buffer 6 and a control signal outputted from control circuit 8, and performs a write operation to a plurality of nonvolatile memory cells in memory cell array 12. In addition, write and read circuit 220 receives internal address signals A0 to An and the control signal, and performs a read operation to a plurality of nonvolatile memory cells in memory cell array 12. The data thus read is outputted to the outside of memory 100 through data input/output buffer 6 and data signal terminal 3.

Since the remaining circuit configurations are the same as that shown in FIG. 1, they will not be repeatedly described herein.

Figure 15:
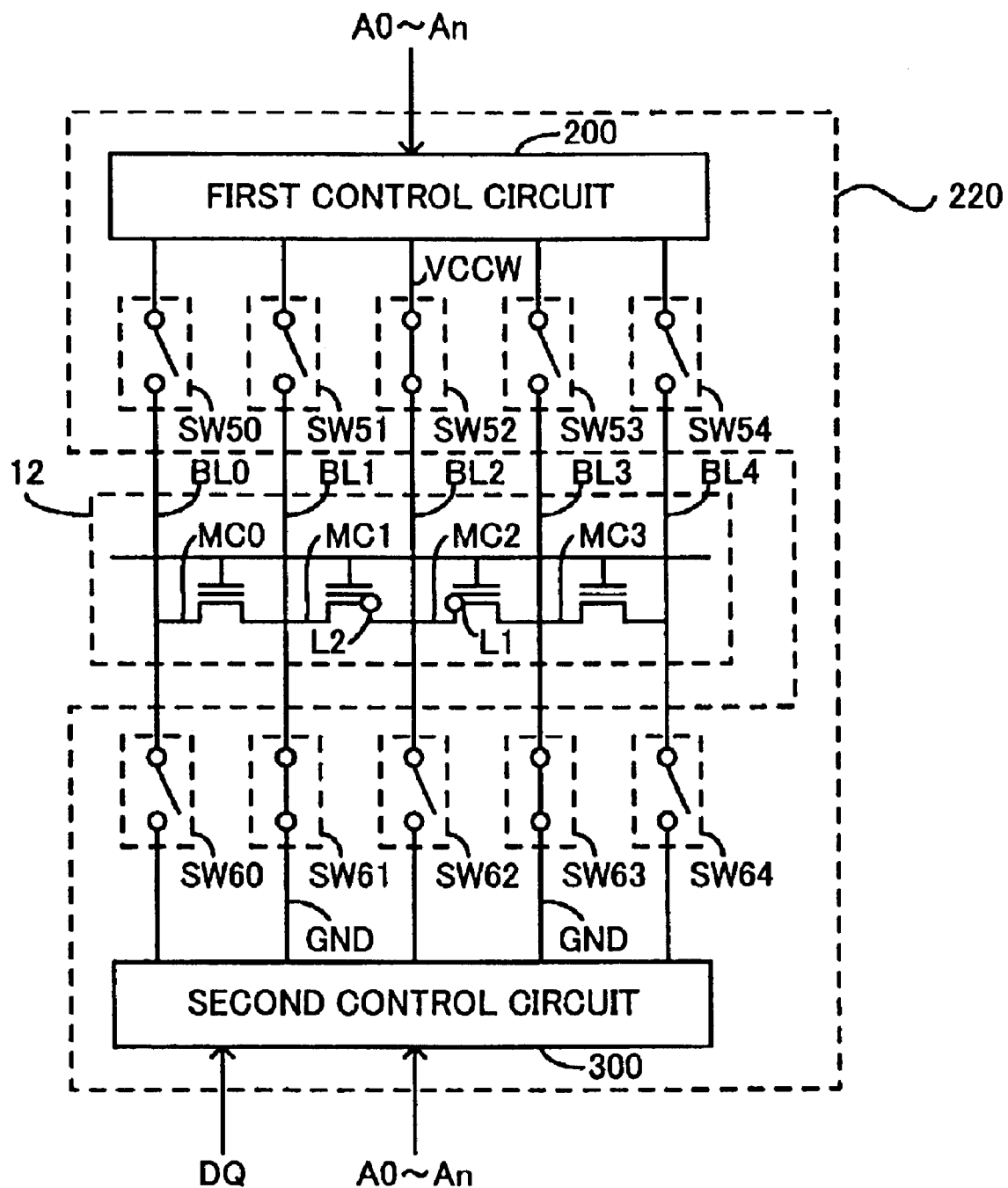
FIG. 15 is a block diagram for explaining an example of the write operation of a write and read circuit shown in FIG. 14.

FIG. 15 is a block diagram for describing an example of the write operation of write and read circuit 220 shown in FIG. 14.

Referring to FIG. 15, write and read circuit 220 includes a first control circuit 200, a second control circuit 300, a plurality of first switch circuits SW50 to SW54, and a plurality of second switch circuits SW60 to SW64.

First switch circuits SW50 to SW54 are connected to first control circuit 200. Second switch circuits SW60 to SW64 are connected to second control circuit 300.

Figure 27:
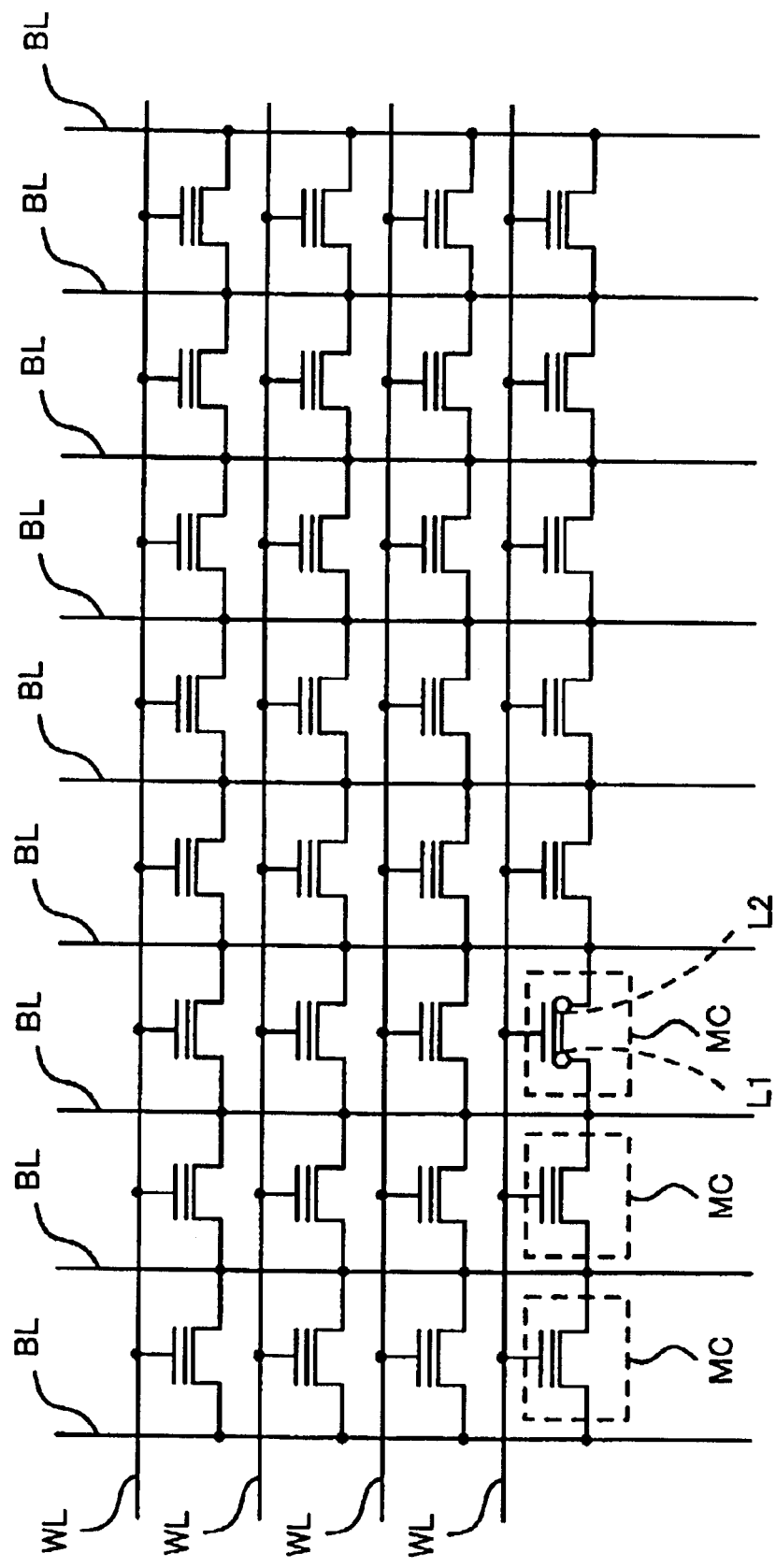
FIG. 27 is a circuit diagram showing the configuration of a conventional nonvolatile semiconductor memory device.
Figure 28A:
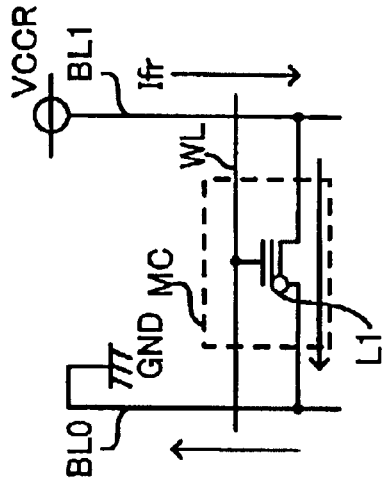
FIGS. 28A to 28D are views showing a data write operation and a data read operation for two storage regions in a nonvolatile memory cell.
Figure 28B:
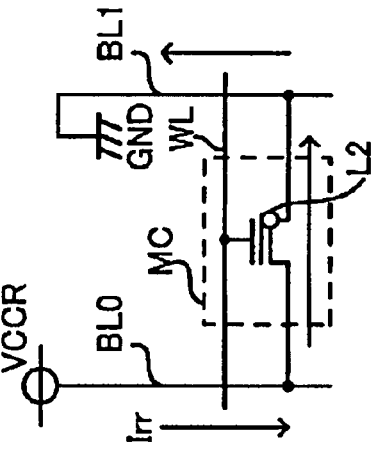
Figure 28C:
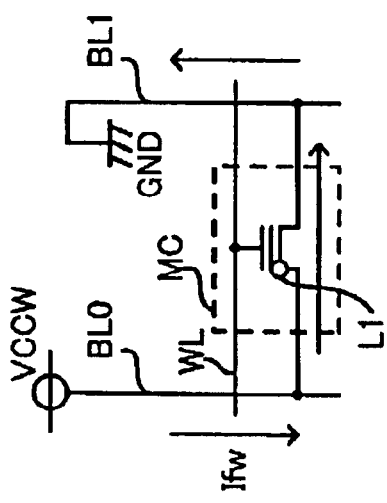
Figure 28D:
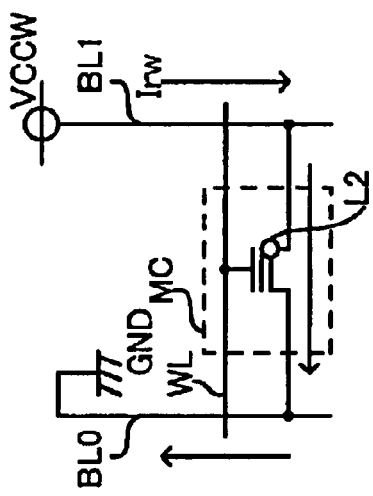
Figure 29:
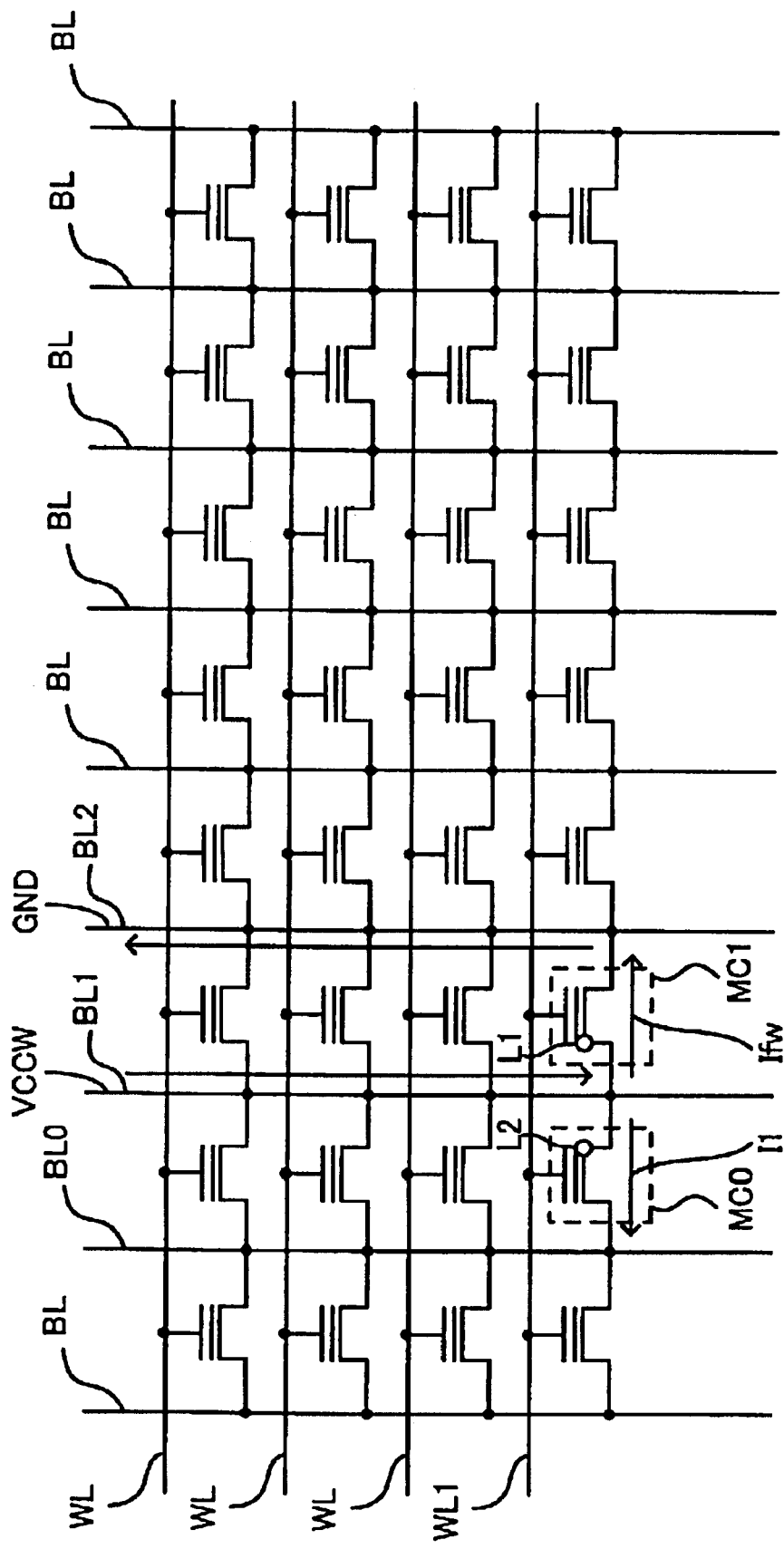
FIG. 29 is an explanatory view for a write operation for writing data to a nonvolatile memory cell included in the memory cell array shown in FIG. 27.

Memory array 12 includes a plurality of bit lines BL0 to BL4, a plurality of nonvolatile memory cells MC0 to MC3 and word lines WL. For the brevity of the description, FIG. 15 shows the simplified circuit configuration of memory cell array 12. Actually, as shown in FIG. 27, memory cell array 12 includes a plurality of word lines, a plurality of bit lines and a plurality of nonvolatile memory cells.

Bit line BL0 is connected to first switch circuit SW50 and second switch circuit SW60. Likewise, bit line BL1 is connected to first switch circuit SW51 and second switch circuit SW61. Bit line BL2 is connected to first switch circuit SW52 and second switch circuit SW62. Bit line BL3 is connected to first switch circuit SW53 and second switch circuit SW63. Bit line BL4 is connected to first switch circuit SW54 and second switch circuit SW64.

It is now assumed that H-level data is written to storage region L2 of nonvolatile memory cell MC1 and H-level data is written to storage region L1 of memory cell MC2. In this case, first control circuit 200 in write and read circuit 220 receives address signals A0 to An, turns on first switch circuit SW52 and supplies write potential VCCW to bit line BL2. In addition, second control circuit 300 receives address signals A0 to An and data signal DQ, turns on second switch circuits SW61 and SW63, and supplies ground potential GND to bit lines BL1 and BL3. As a result, data is written to memory cells MC1 and MC2. Since other bit lines BL0 and BL4 are not connected to first or second control circuit, bit lines BL0 and BL4 are turned into a floating state. As a result, no write current flows therein.

Figure 16:
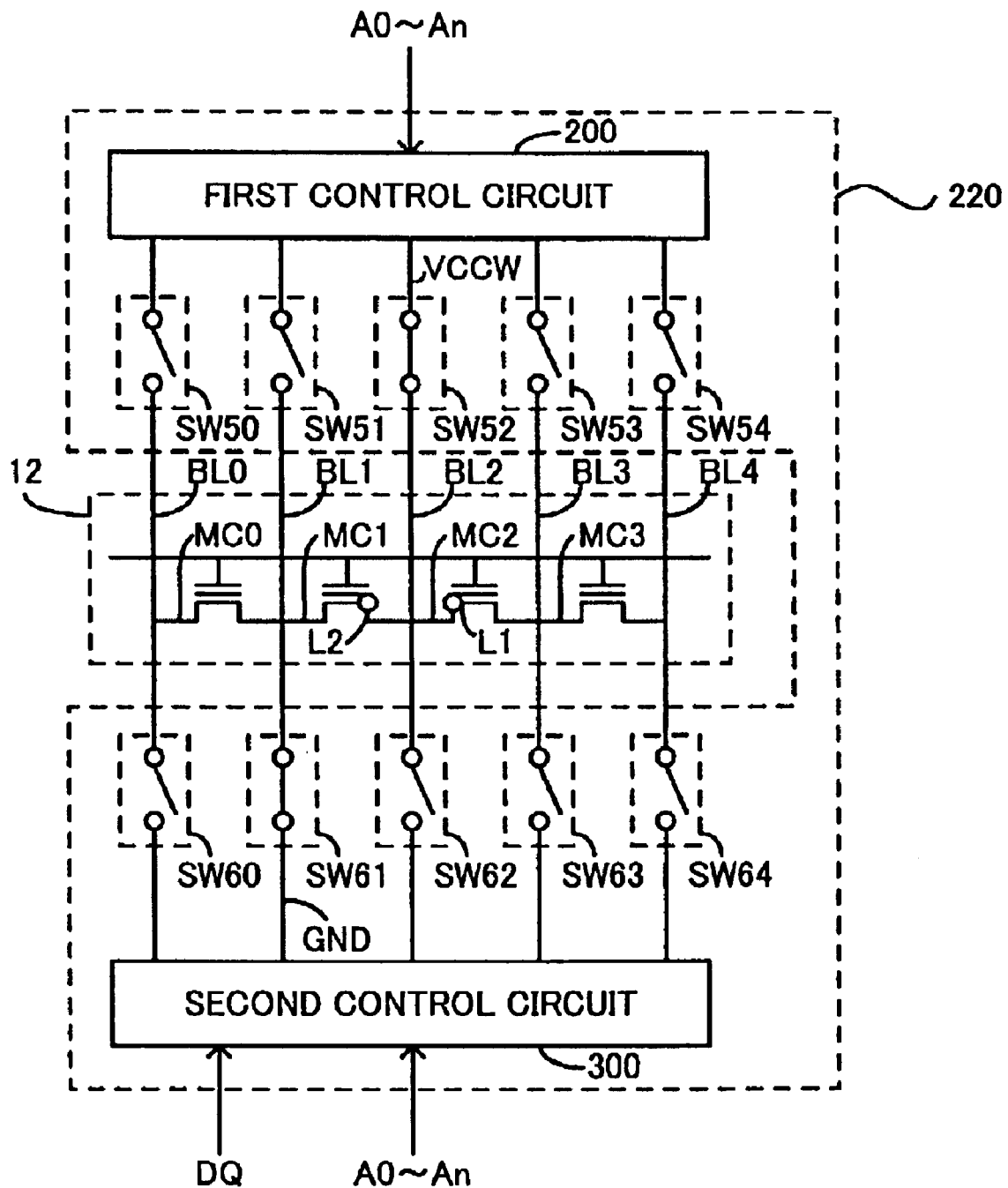
FIG. 16 is a block diagram for explaining another example of the write operation of the write and read circuit shown in FIG. 14.

FIG. 16 is a block diagram for describing the other example of the write operation of write and read circuit 220 shown in FIG. 14.

Referring to FIG. 16, it is assumed that H-level data is written to storage region L2 of nonvolatile memory cell MC1 and L-level data is written to storage region L1 of memory cell MC2. In this case, first control circuit 200 in write and read circuit 220 receives address signals A0 to An and turns on first switch SW52. In addition, second control circuit 300 receives address signals A0 to An and data signal DQ, turns on only second switch SW61, and supplies ground potential GND to bit line BL1. As a result, H-level data is written to memory cell MC1 and no write current is carried to memory cell MC2.

Likewise, it is assumed that L-level data is written to storage region L2 of nonvolatile memory cell MC1 and L-level data is written to storage region L1 of memory cell MC2. In this case, while the operation of first control circuit 200 is the same as that shown in FIGS. 15 and 16, second operation 300 turns off all of second switch circuits SW60 to SW64. As a result, no write current is carried to memory cells MC1 and MC2.

Figure 17:
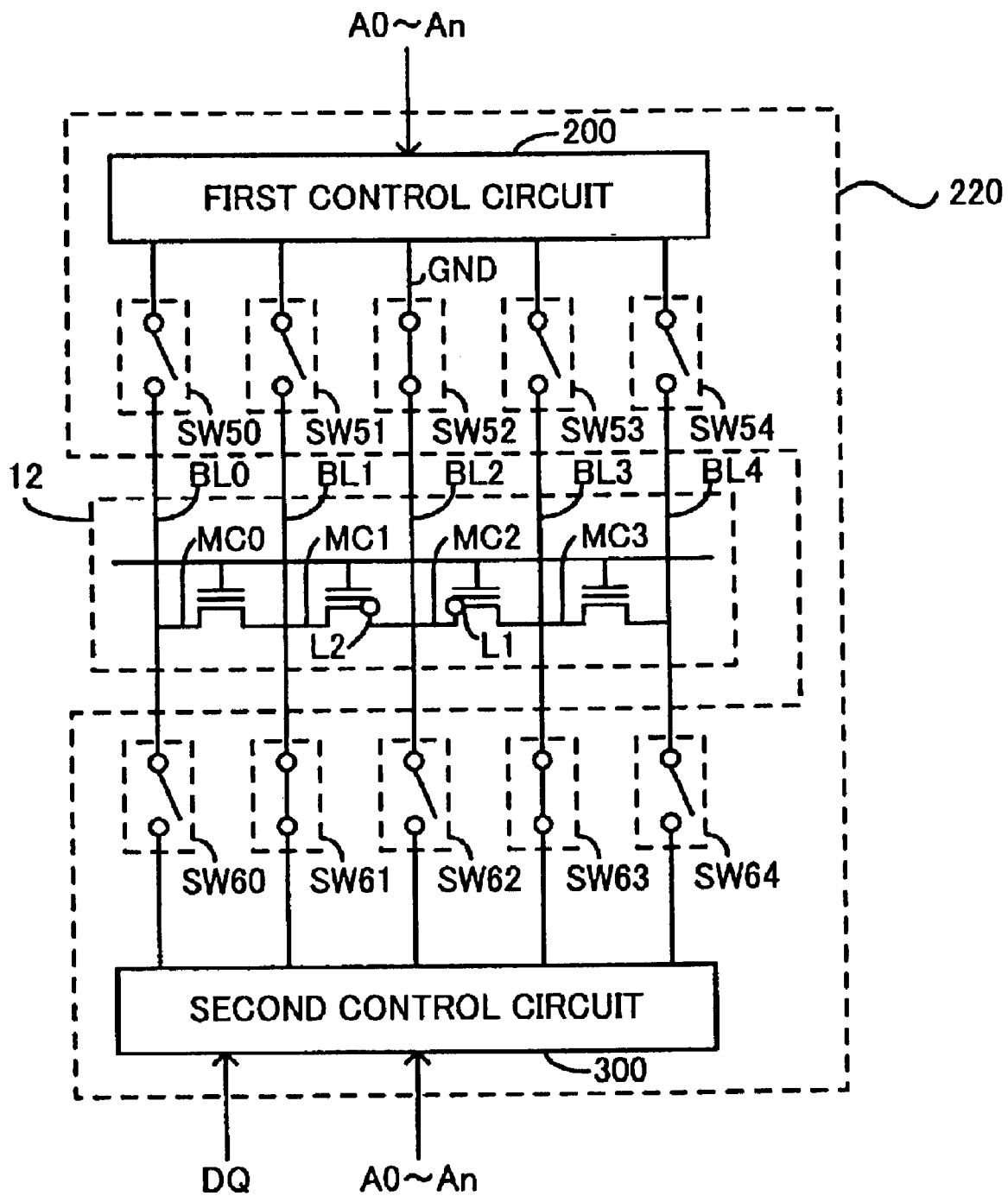
FIG. 17 is a block diagram for explaining an example of the read operation of the write and read circuit shown in FIG. 14.

FIG. 17 is a block diagram for explaining one example of the read operation of write and read circuit 220 shown in FIG. 14.

Referring to FIG. 17, it is assumed that data is read from storage region L2 of nonvolatile memory cell MC1 and data is read from storage region L1 of memory cell MC2.

In this case, first control circuit 200 in write and read circuit 220 receives address signals A0 to An, and turns on first switch circuit SW52. At this moment, first control circuit 200 supplies ground potential GND to bit line BL2. Further, second control circuit 300 receives address signals A0 to An, turns on second switch circuits SW61 and SW63, and connects bit lines BL1 and BL3 to the sense amplifier, not shown. As a result, data is read from memory cells MC1 and MC2.

Figure 18:
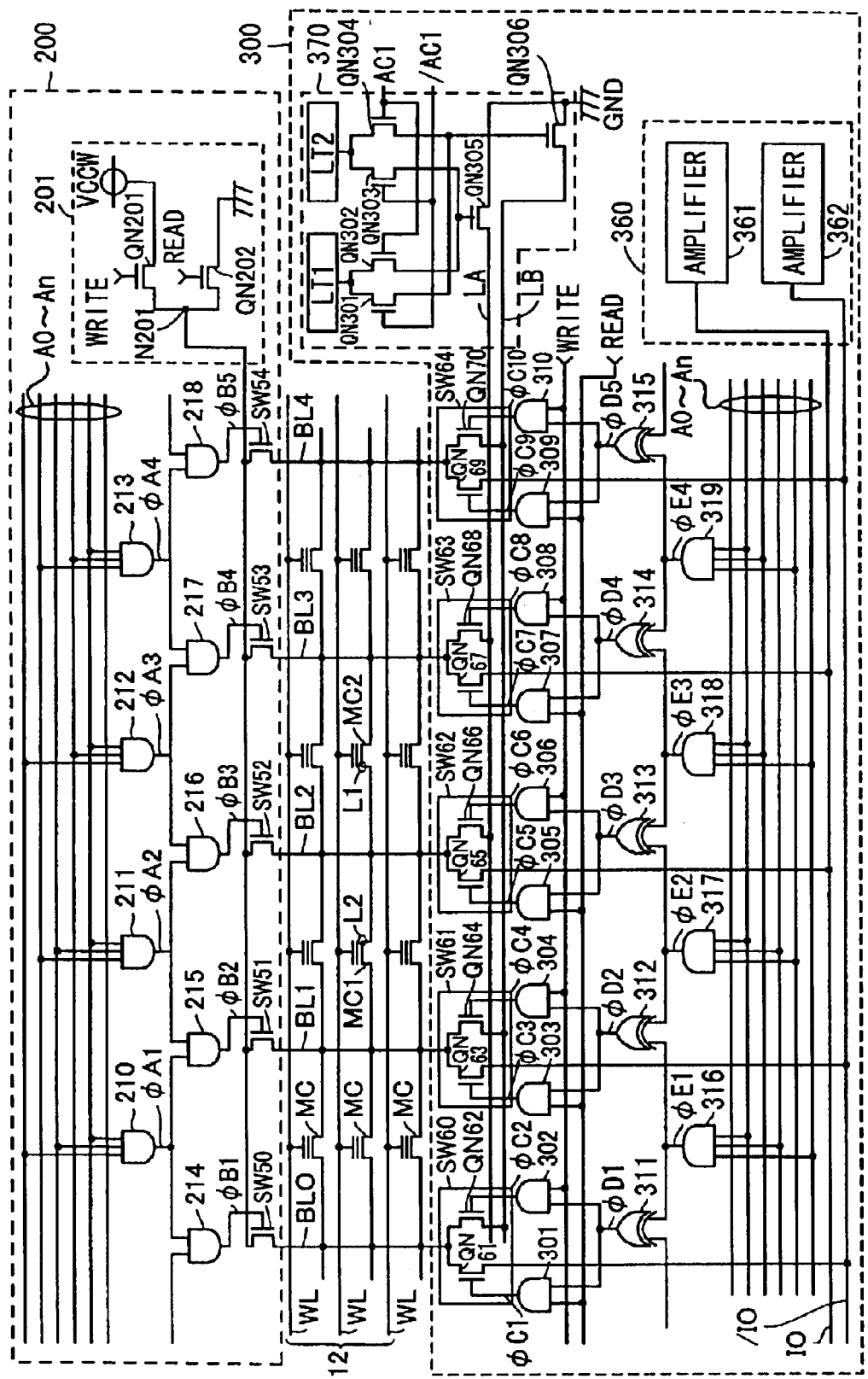
FIG. 18 is a circuit diagram showing the detailed configurations of the write and read circuit and the memory cell array shown in FIG. 14.

FIG. 18 is a circuit diagram showing the detailed configurations of write and read circuit 220 and memory cell array 12 shown in FIG. 14.

Referring to FIG. 18, first control circuit 200 includes a plurality of logic gates 210 to 218 and a potential supply circuit 201.

Each of logic gates 210 to 213 receives address signals A0 to An from three input terminals and outputs an AND logic operation result. Logic gate 214 receives the output signal of logic gate 210 and that of a logic gate, not shown, adjacent logic gate 210, and outputs an AND logic operation result. Likewise, logic gate 215 receives the output signal of logic gate 210 and that of logic gate 211, and outputs an AND logic operation result. Logic gate 216 receives the output signal of logic gate 211 and that of logic gate 212, and outputs an AND logic operation result. Logic gate 217 receives the output signal of logic gate 212 and that of logic gate 213, and outputs an AND logic operation result. Logic gate 218 receives the output signal of logic gate 213 and that of a logic gate, not shown, adjacent logic gate 213 and outputs an AND logic operation result.

Potential supply circuit 201 includes N-channel MOS transistors QN201 and QN202. Transistor QN201 is connected between write potential node VCCW and an output node N201, and write signal WRITE is inputted into the gate thereof. In addition, transistor QN202 is connected between ground node GND and output node N201, and read signal READ is inputted into the gate thereof.

Each of first switch circuits SW50 to SW54 includes an N-channel MOS transistor. First switch SW50 is connected between bit line BL0 and output node N201 and the output signal of logic gate 214 is inputted into the gate thereof. First switch SW51 is connected between bit line BL1 and output node N201 and the output signal of logic gate 215 is inputted into the gate thereof. First switch SW52 is connected between bit line BL2 and output node N201 and the output signal of logic gate 216 is inputted into the gate thereof. First switch SW53 is connected between bit line BL3 and output node N201 and the output signal of logic gate 217 is inputted into the gate thereof. First switch SW54 is connected between bit line BL4 and output node N201 and the output signal of logic gate 218 is inputted into the gate thereof.

Memory cell array 12 includes a plurality of word lines WL, a plurality of bit lines BL0 to BL4 and a plurality of nonvolatile memory cells MC.

Second control circuit 300 includes a data input circuit 370, an amplifier circuit 360 and a plurality of logic gates 301 to 319.

Data input circuit 370 includes latch circuits LT1 and LT2, and N-channel MOS transistors QN301 to QN306.

Transistor QN301 is connected between latch circuit LT1 and the gate of transistor QN306 and lowest address signal AC1 is inputted into the gate thereof. Transistor QN302 is connected between latch circuit LT1 and the gate of transistor QN305 and a complementary address signal /AC1 to lowest address signal AC1 is inputted into the gate thereof. Transistor QN303 is connected between latch circuit LT2 and the gate of transistor QN305 and address signal /AC1 is inputted into the gate thereof. Transistor QN304 is connected between latch circuit LT2 and the gate of transistor QN306 and address signal AC1 is inputted into the gate thereof. Transistor QN305 is connected between ground potential node GND and a signal line LA. Transistor QN306 is connected between ground potential node GND and a signal line LB.

Amplifier circuit 360 includes sense amplifiers 361 and 362. Sense amplifier 361 is connected to a data input/output line IO. Sense amplifier 362 is connected to a data input/output line /IO.

Each of logic gates 316 to 319 has three input terminals and corresponding address signals A0 to An are inputted into the respective input terminals. Each of logic circuits 316 to 319 receives three address signals and outputs an AND logic operation result. Logic gate 311 receives the output signal of logic gate 316 and that of a logic gate, not shown, adjacent logic circuit 316, and outputs an EX-OR logic operation result. Logic gate 312 receives the output signal of logic gate 316 and that of logic gate 317, and outputs an EX-OR logic operation result. Logic gate 313 receives the output signal of logic gate 317 and that of logic gate 318, and outputs an EX-OR logic operation result. Logic gate 314 receives the output signal of logic gate 318 and that of logic gate 319, and outputs an EX-OR logic operation result. Logic gate 315 receives the output signal of logic gate 319 and that of a logic gate, not show, adjacent logic gate 319, and outputs an EX-OR logic operation result.

Logic gate 301 receives read signal READ and the output signal of logic gate 311, and outputs an AND logic operation result. Logic gate 302 receives write signal WRITE and the output signal of logic gate 311, and outputs an AND logic operation result.

Likewise, logic gate 303 receives read signal READ and the output signal of logic gate 312, and logic gate 304 receives write signal WRITE and the output signal of logic gate 312. Logic gate 305 receives read signal READ and the output signal of logic gate 313, and logic gate 306 receives write signal WRITE and the output signal of logic gate 313. Logic gate 307 receives read signal READ and the output signal of logic gate 314, and logic gate 308 receives write signal WRITE and the output signal of logic gate 314. Logic gate 309 receives read signal READ and the output signal of logic gate 315, and logic gate 310 receives write signal WRITE and the output signal of logic gate 315. All of logic gates 303 to 310 output AND logic operation results, respectively.

Second switch circuit SW60 includes N-channel MOS transistors QN61 and QN62. Transistor QN61 is connected between bit line BL0 and data input/output line/IO and the gate thereof receives the output signal of logic gate 301. Transistor QN62 is connected between bit line BL0 and signal line LB and the gate thereof receives the output signal of logic gate 302. Second switch circuit SW61 includes N-channel MOS transistors QN63 and QN64. Transistor QN63 is connected between bit line BL1 and data input/output line /IO and the gate thereof receives the output signal of logic gate 303. Transistor QN64 is connected between bit line BL1 and signal line LB and the gate thereof receives the output signal of logic gate 304. Second switch circuit SW62 includes N-channel MOS transistors QN65 and QN66. Transistor QN65 is connected between bit line BL2 and data input/output line IO and the gate thereof receives the output signal of logic gate 305. Transistor QN66 is connected between bit line BL2 and signal line LA and the gate thereof receives the output signal of logic gate 306. Second switch circuit SW63 includes N-channel MOS transistors QN67 and QN68. Transistor QN67 is connected between bit line BL3 and data input/output line IO and the gate thereof receives the output signal of logic gate 307. Transistor QN68 is connected between bit line BL3 and signal line LA and the gate thereof receives the output signal of logic gate 308. Second switch circuit SW64 includes N-channel MOS transistors QN69 and QN70. Transistor QN69 is connected between bit line BL4 and data input/output line /IO and the gate thereof receives the output signal of logic gate 309. Transistor QN70 is connected between bit line BL4 and signal line LB and the gate thereof receives the output signal of logic gate 310.

As for the nonvolatile semiconductor memory device having the above-described circuit configuration, the operation of write and read circuit 220 when H-level data is written to storage region L2 of memory cell MC1 and L-level data is written to storage region L1 of memory cell MC2 shown in FIG. 18 will be described.

Figure 19:
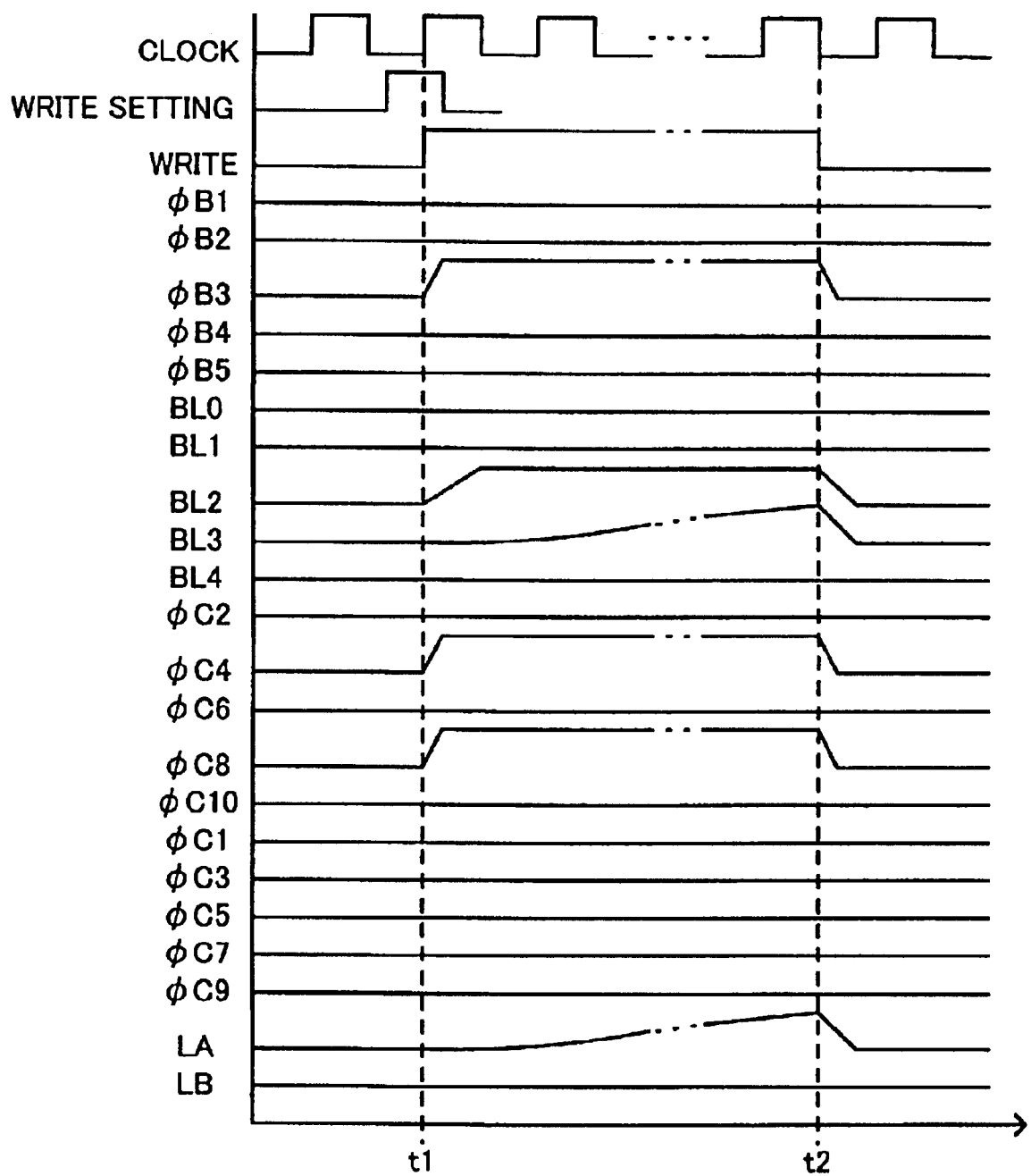
FIG. 19 is a timing chart showing the write operation of the write and read circuit.

FIG. 19 is a timing chart showing the write operation of read and write circuit 220.

Referring to FIG. 19, control circuit 8 activates write signal WRITE to H level during a period from time t1 to time t2, in response to a clock signal CLK. At this moment, all the internal address signals inputted into logic gates 211 and 212 among internal address signals A0 to An are set at H level. Therefore, the output signal $\phi$A2 of logic gate 211 and the output signal $\phi$A3 of logic gate 212 become H level. The output signals $\phi$A1 and $\phi$A4 of other logic gates 210 and 213 become L level. As a result, among output signals $\phi$B1 to $\phi$B5 of logic gates 214 to 218, respectively, only output signal $\phi$B3 of logic gate 216 becomes H level. Consequently, first switch circuit SW52 among first switch circuits SW50 to SW54 is turned on.

On the other hand, the output signals $\phi$E2 and $\phi$E3 become H level by internal address signals A0 to An among the output signals $\phi$E1 to $\phi$E4 of logic gates 316 to 319, respectively. As a result, signals $\phi$D2 and $\phi$D4 become H level among the output signals $\phi$D1 to $\phi$D5 of logic gates 311 to 315, respectively.

Therefore, signals $\phi$C4 and $\phi$C8 become H level among the output signals $\phi$C1 to $\phi$C10 of logic gates 301 to 310, respectively. As a result, transistor QN64 in second switch circuit SW61 and transistor QN68 in second switch circuit SW63 are turned on.

Latch circuit LT1 in data input circuit 370 latches L-level data, and latch circuit LT2 latches H-level data. When H-level data and L-level data are written to storage region L2 of memory cell MC1 and storage region L1 of memory cell MC2, respectively, address signal AC1 becomes H level and address signal /AC1 becomes L level. Therefore, transistors QN302 and QN304 are turned on and transistors QN301 and QN303 are turned off. As a result, transistor QN305 is turned off and transistor QN306 is turned on. Consequently, signal line LA turns into a floating state and the potential of signal line LB is kept to be ground potential GND.

Potential supply circuit 201 receives write signal WRITE activated at the time t1 and turns on transistor QN201. As a result, the potential of output node 201 is kept to be write potential VCCW.

Therefore, the potential of bit line BL2 is kept to be write potential VCCW and that of bit line BL1 is kept to be ground potential GND. In addition, bit line BL3 turns into a floating state.

As a result of the above, storage region L2 of memory cell MC1 traps electrons so as to increase a threshold. Therefore, storage region L2 of memory cell MC1 stores H-level data. On the other hand, storage region L1 of memory cell MC2 holds an erasure state. Therefore, storage region L1 of memory cell MC2 does not store data.

It is noted that signal line LA and bit line BL3 are in a floating state. Therefore, the potentials of signal line LA and bit line BL3 increase during the write operation.

Figure 20:
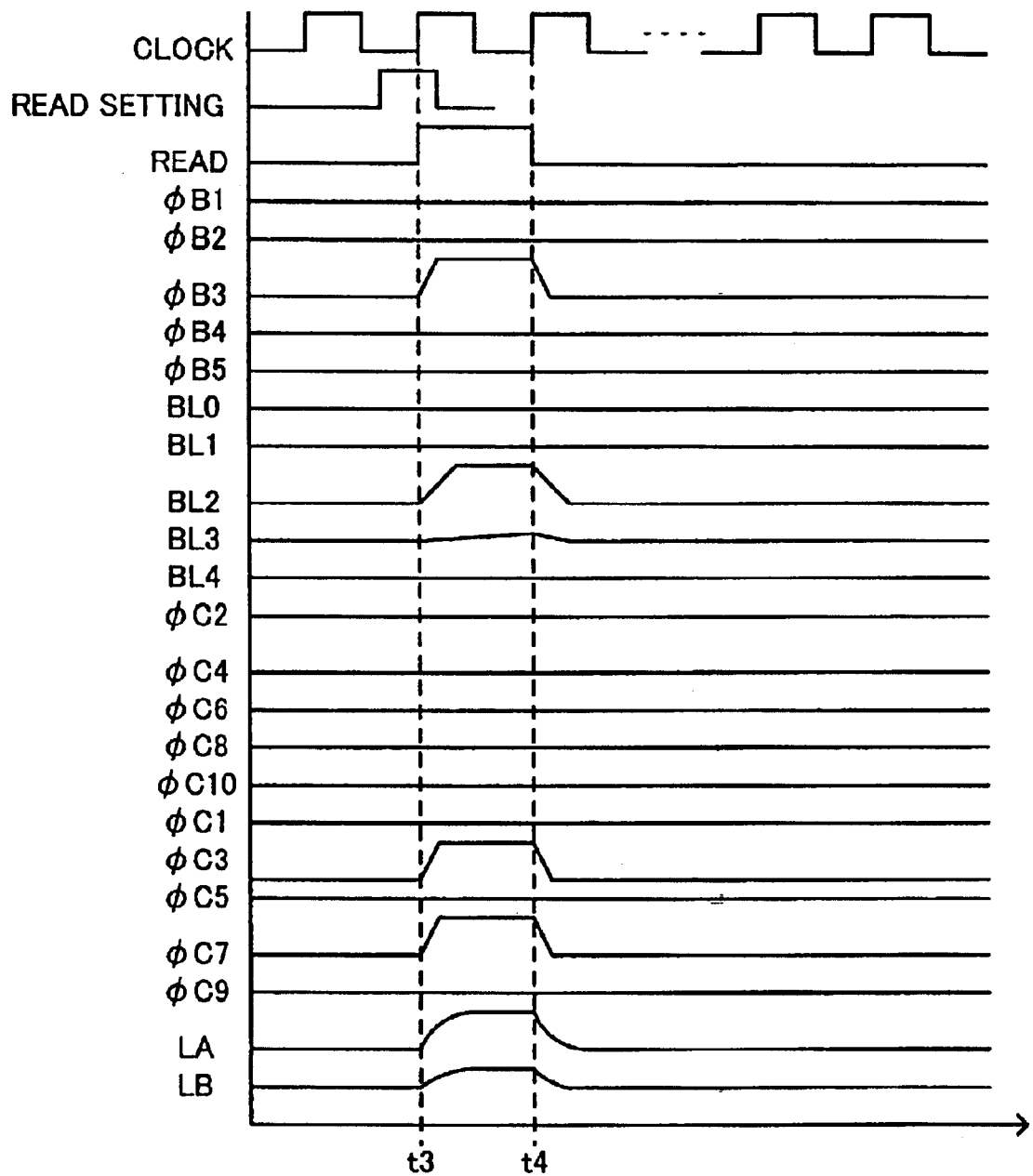
FIG. 20 is a timing chart showing the read operation of the write and read circuit.

FIG. 20 is a timing chart showing the read operation of write and read circuit 220.

Referring to FIG. 20, in response to clock signal CLK, control circuit 8 activates read signal READ to H level during a period from time t3 to time t4. At this moment, output signal $\phi$A2 of logic gate 211 and output signal $\phi$A3 of logic gate 212 become H level by internal address signals A0 to An. As a result, among output signals $\phi$B1 to $\phi$B5 of logic gates 214 to 218, only output signal $\phi$B3 of logic gate 216 becomes H level. As a result, among first switch circuits SW50 to SW54, first switch circuit SW52 is turned on.

Meanwhile, signals $\phi$E2 and $\phi$E3 become H level by internal address signals A0 to An. As a result, among output signals $\phi$D1 to $\phi$D5 of logic gates 311 to 315, respectively, signals $\phi$D2 and $\phi$D4 become H level.

Therefore, among output signals φC1 to φC10 of logic gates 301 to 310, respectively, signals φC3 and φC7 become H level. As a result, transistor QN63 in second switch circuit SW61 and transistor QN67 in second switch circuit SW63 are turned on.

Potential supply circuit 201 receives read signal READ activated at time t3, and turns on transistor QN202. As a result, output node 201 is kept to have ground potential GND.

Therefore, the potential of bit line BL2 is kept to be ground potential GND. In addition, write potential VCCR is supplied to bit lines BL1 and BL3 through sense amplifiers 303 and 304.

At this moment, storage region L2 of memory cell MC1 stores H-level data and a threshold is, therefore, high. Thus, no current is carried to memory cell MC1 and the potential of bit line BL1, therefore, rises. On the other hand, since storage region L1 of memory cell MC2 stores L-level data, a threshold is high. Therefore, a current flows in memory cell MC2. Compared with the potential of bit line BL2, the potential of bit line BL3 is low. By allowing sense amplifiers 361 and 362 to sense the potentials of bit lines BL1 and BL3, data is read from storage region L2 of memory cell MC1 and data is read from storage region L1 of memory cell MC2.

Fourth Embodiment

In the third embodiment of the present invention, description has been given to a case where one-level data is stored in each of two storage regions L1 and L2 of nonvolatile memory cell MC and a case where two-level data is stored in the memory cell. It is also possible to store data of two or more levels in the nonvolatile memory cell.

Figure 21:
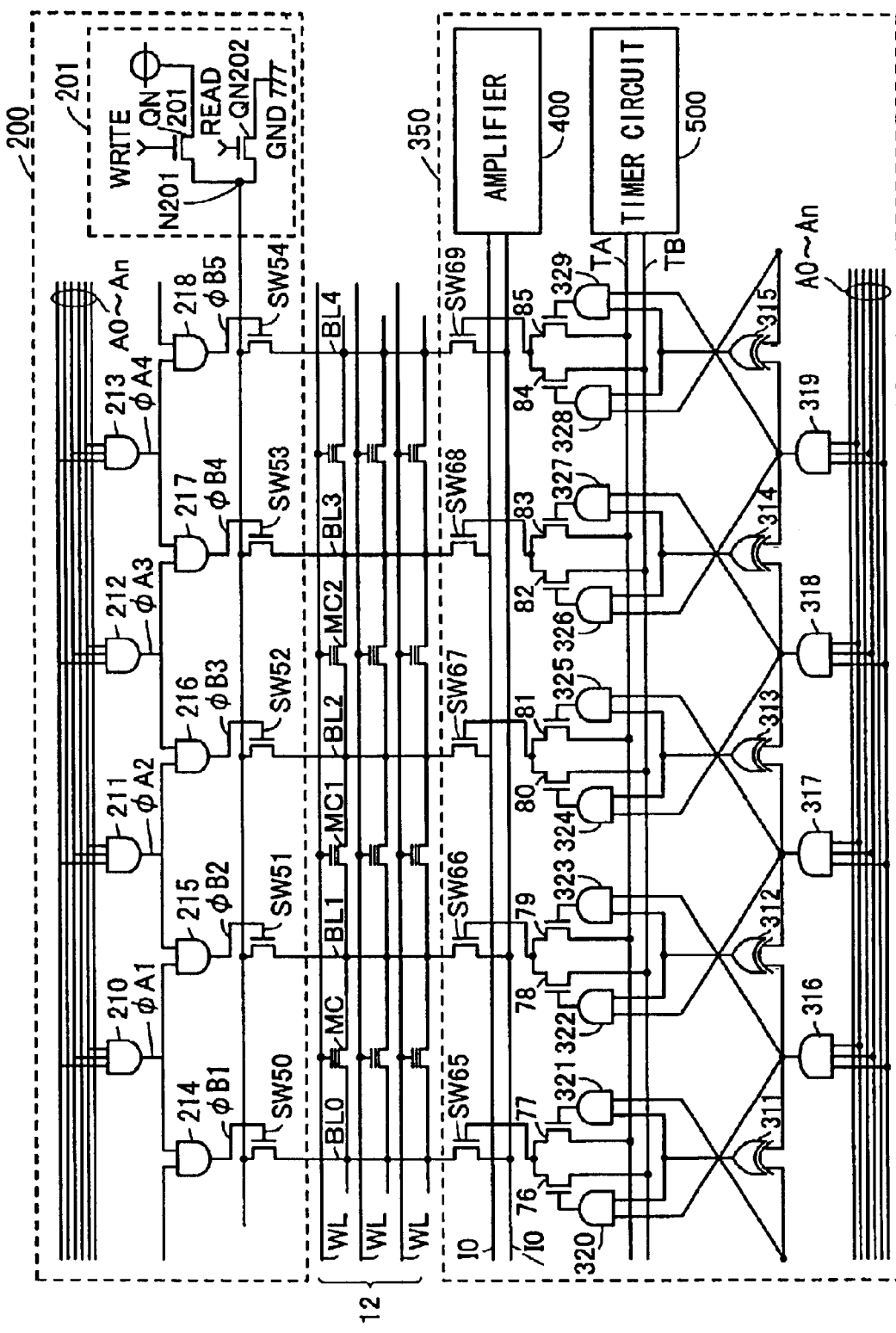
FIG. 21 is a circuit diagram showing the configurations of a write and read circuit and a memory cell array in the fourth embodiment of the present invention.

FIG. 21 is a circuit diagram showing the configurations of a write and read circuit and a memory cell array in the fourth embodiment of the present invention.

Referring to FIG. 21, the configurations of first control circuit 200 and first switch circuits SW50 to SW54 are the same as those shown in FIG. 18, which description will not be therefore repeatedly given herein.

Each of second switch circuits SW65 to SW69 includes an N-channel MOS transistor. Second switch circuit SW65 is connected between bit line BL0 and data input/output line /IO. Second switch circuit SW66 is connected between bit line BL1 and data input/output line /IO. Second switch circuit SW67 is connected between bit line BL2 and data input/output line IO. Second switch circuit SW68 is connected between bit line BL3 and data input/output line IO. Second switch circuit SW69 is connected between bit line BL4 and data input/output line /IO.

Second control circuit includes amplifier circuit 400, timer circuit 500, N-channel MOS transistors 76 to 85 and logic gates 311 to 329.

Since the connection relationship between logic gates 316 to 319 and logic gates 311 to 315 is the same as that shown in FIG. 18, it will not be repeatedly described herein.

Transistor QN76 is connected between the gate of second switch circuit SW65 and a signal line TB. Transistor QN77 is connected between the gate of second switch circuit SW65 and a signal line TA. Likewise, transistor QN78 is connected between the gate of second switch circuit SW66 and signal line TB. Transistor QN79 is connected between the gate of second switch circuit SW66 and signal line TA. Transistor QN80 is connected between the gate of second switch circuit SW67 and signal line TB. Transistor QN81 is connected between the gate of second switch circuit SW67 and signal line TA. Transistor QN82 is connected between the gate of second switch circuit SW68 and signal line TB. Transistor QN83 is connected between the gate of second switch circuit SW68 and signal line TA. Transistor QN84 is connected between the gate of second switch circuit SW69 and signal line TB. Transistor QN85 is connected between the gate of second switch circuit SW69 and signal line TA.

Logic gate 320 receives the output signal of logic gate 316 and that of logic gate 311, and outputs an AND logic operation result to the gate of transistor QN76. Logic gate 321 receives the output signal of a logic gate, not shown, adjacent logic circuit 316 and that of logic gate 311, and outputs an AND logic operation result to the gate of transistor QN77. Logic gate 322 receives the output signal of logic gate 317 and that of logic gate 312, and outputs an AND logic operation result to the gate of transistor QN78. Logic gate 323 receives the output signal of logic gate 316 and that of logic gate 312, and outputs an AND logic operation result to the gate of transistor QN79. Logic gate 324 receives the output signal of logic gate 318 and that of logic gate 313, and outputs an AND logic operation result to the gate of transistor QN80. Logic gate 325 receives the output signal of logic gate 317 and that of logic gate 313, and outputs an AND logic operation result to the gate of transistor QN81. Logic gate 326 receives the output signal of logic gate 319 and that of logic gate 314, and outputs an AND logic operation result to the gate of transistor QN82. Logic gate 327 receives the output signal of logic gate 318 and that of logic gate 314, and outputs an AND logic operation result to the gate of transistor QN83. Logic gate 328 receives the output signal of a logic gate, not shown, adjacent logic gate 319 and that of logic gate 315, and outputs an AND logic operation result to the gate of transistor QN84. Logic gate 329 receives the output signal of logic gate 319 and that of logic gate 315, and outputs an AND logic operation result to the gate of transistor QN85.

Figure 22:
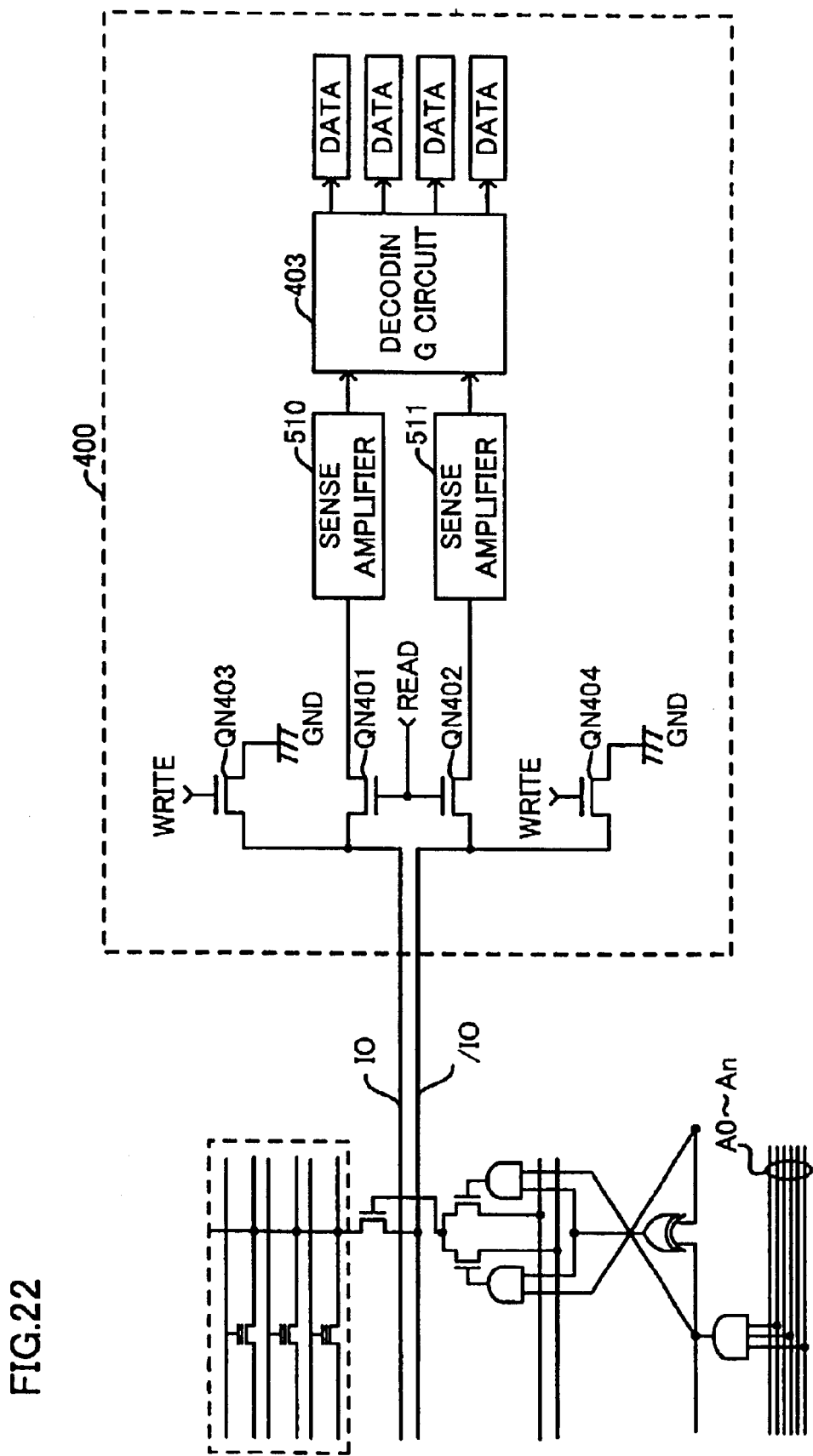
FIG. 22 is a circuit diagram showing the configuration of an amplifier circuit shown in FIG. 21.

FIG. 22 is a circuit diagram showing the configuration of amplifier circuit 400 shown in FIG. 21.

Referring to FIG. 22, amplifier circuit 400 includes N-channel MOS transistors QN401 to QN404, sense amplifiers 510 and 511, and a decoding circuit 403.

Transistor QN403 is connected between data input/output line IO and ground potential node GND, and the gate thereof receives write signal WRITE. Transistor QN401 is connected between data input/output line IO and sense amplifier 510, and the gate thereof receives read signal READ. Transistor QN402 is connected between data input/output line /IO and sense amplifier 511, and the gate thereof receives read signal READ. Transistor QN404 is connected between data input/output line /IO and ground potential node GND, and the gate thereof receives write signal WRITE.

Decoding circuit 403 outputs four-level data based on the sense results outputted from sense amplifiers 510 and 511.

Figure 23:
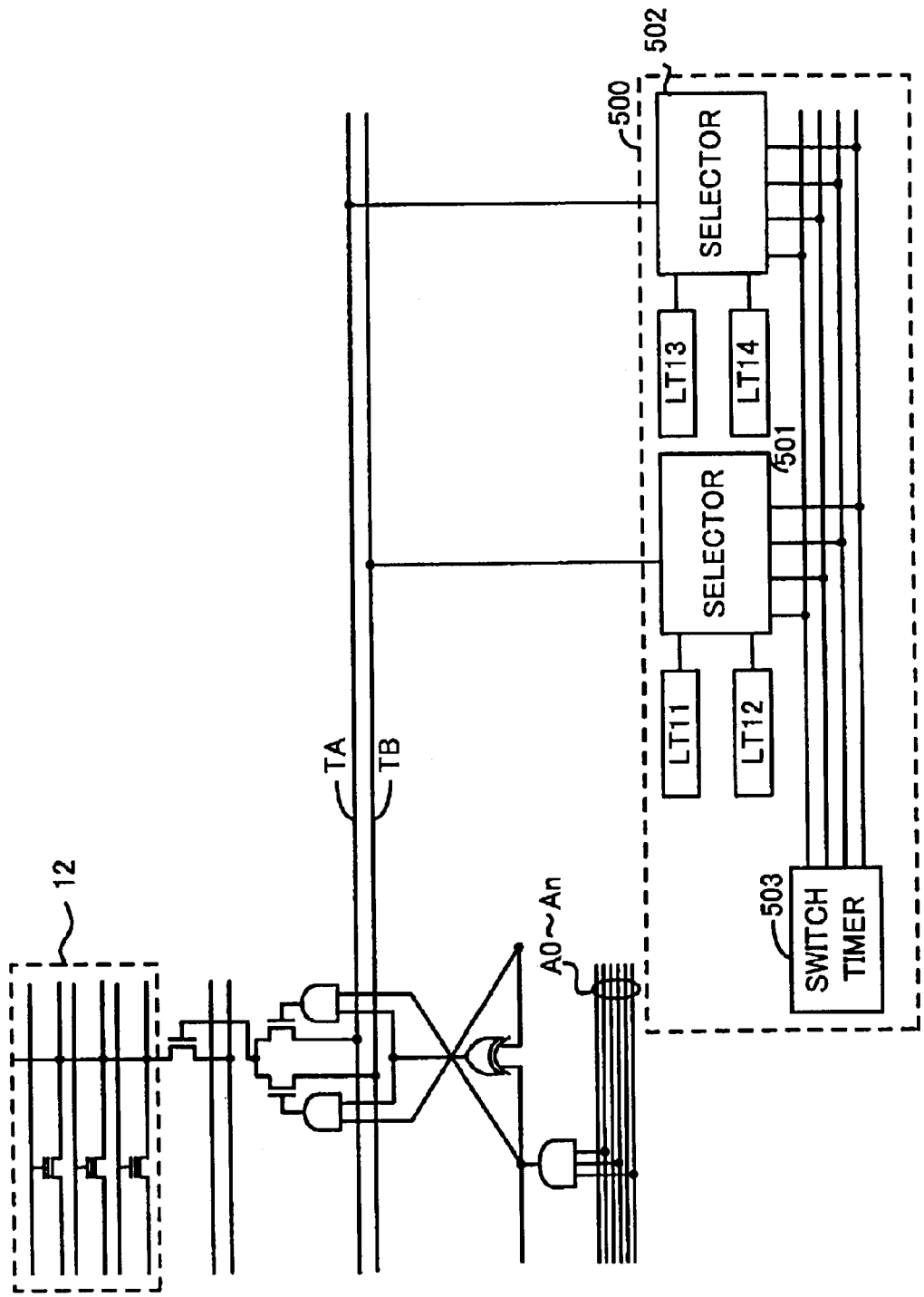
FIG. 23 is a circuit diagram showing the configuration of a timer circuit shown in FIG. 21.

FIG. 23 is a circuit diagram showing the configuration of timer circuit 500 shown in FIG. 21.

Referring to FIG. 23, timer circuit 500 includes a plurality of latch circuits LT11 to LT14, selectors 501 and 502, and a switch timer 503.

Each of latch circuits LT11 and LT12 stores data stored in storage region L2 of memory cell MC. Each of latch circuits LT13 and LT14 stores data stored in storage region L2 of memory cell MC.

Switch timer 503 outputs four switch signals SS different in the period of H level. Selector 501 receives four switch signals SS outputted from switch timer 503, and outputs switch signals SS in accordance with a combination of the data latched by latch circuits LT11 and LT12 to signal line TB. Likewise, selector 502 receives four switch signals SS outputted from switch timer 503, and outputs switch signals SS in accordance with a combination of the data latched by latch circuits LT13 and LT14 to signal line TA.

As for the nonvolatile semiconductor memory device having the above-described circuit configuration, the operation of write and read circuit 220 when writing data to storage region L2 of memory cell MC1 and to storage region L1 of memory cell MC2 shown in FIG. 21 will be described.

When write signal WRITE becomes H level, the output signal of logic gate 211 and that of logic gate 212 become H level by address signals A0 to An. As a result, the output signal of logic gate 216 becomes H level and first switch circuit SW52 is turned on.

In addition, the output signal of logic gate 317 and that of logic gate 318 become H level by address signals A0 to An. Therefore, the output signal of logic gate 322 and that of logic gate 327 become H level. As a result, both of transistors QN78 and QN83 are turned on.

At this moment, the potentials of data signal line pair IO and /IO are both kept to be ground potential GND by write signal WRITE.

Therefore, second switch circuit SW66 is turned on while switch signals SS transmitted by signal line TB is at H level. As a result, the potential of bit line BL1 is kept to be ground potential GND. Likewise, second switch circuit SW83 is turned on while switch signal SS transmitted by signal line TA is at H level. As a result, the potential of bit line BL3 is kept to be ground potential GND.

Other second switch circuits 65, 67 and 69 remain off. Therefore, the potential of bit line BL2 is kept to be write potential VCCW.

Switch signal SS transmitted by signal line TB is determined by the combination of the data latched by latch circuits LT11 and LT12. Namely, a combination of data latched by latch circuits LT11 and LT12 determines time for which second switch circuit SW66 is turned on. If the data of latch circuit LT11 and that of latch circuit LT12 are both at H level, for example, switch signal SS having the longest H-level period is selected by selector 501. In addition, if the data of latch circuit LT11 and that of latch circuit LT12 are both at L level, for example, L-level switch signal SS is selected by selector 501. Accordingly, a threshold changes according to a combination of the two data stored in storage region L2 of memory cell MC1.

In other words, write time for writing data to memory cell MC1 is adjusted in response to switch signals SS selected by selector 501. The quantity of electrons trapped in memory cell MC1 is, therefore, adjusted. As a result, the threshold of memory cell MC1 changes. Specifically, if the quantity of electrons is larger, the threshold becomes higher and the quantity of current carried to memory cell MC1 during a read operation decreases.

Since memory cell MC1 consists of an N-channel MOS transistor, the threshold rises by trapping the electrons. If memory cell MC1 includes a P-channel MOS transistor, the threshold rises by trapping holes.

Likewise, switch signals SS transmitted by signal line TA are determined by a combination of data latched by latch circuits LT13 and LT14.

Through the above-described operation, it is possible to store 2-bit data in storage region L2 of memory cell MC1 and 2-bit data in storage region L1 of memory cell MC2.

Next, an operation for reading data from storage region L2 of memory cell MC1 and data from storage region L1 of memory cell MC2 will be described.

If read signal READ is activated, first switch circuit SW52 is turned on and other first switch circuits SW50, SW51, SW53 and SW54 are turned off in the read operation.

In addition, transistors QN202 in potential supply circuit 201 is turned on and the potential of output node N201 is kept to be ground potential GND.

In addition, as in the case of the write operation, second switch circuits SW66 and SW68 are turned on. At this moment, read potential VCCR is supplied from the read potential VCCR node, not shown, and the potentials of signal lines TA and TB are both kept to be read potential VCCR.

As a result, a current is carried from bit line BL1 to bit line BL2 through memory cell MC1 and reverse read for reading data from storage region L2 of memory cell MC1 is performed. In addition, a current is carried from bit line BL3 to bit line BL2 through memory cell MC2 and reverse read for reading data from storage region L1 of memory cell MC2 is performed.

In amplifier circuit 400, since read signal READ is activated, transistors QN501 and QN502 are turned on. Therefore, sense amplifier 510 is connected to data input/output line IO and sense amplifier 511 is connected to data input/output line /IO.

Accordingly, sense amplifier 510 detects the current carried from bit line BL1 to memory cell MC1 and outputs a detection result to decoding circuit 403. In addition, sense amplifier 511 detects the current carried from bit line BL3 to memory cell MC2 and outputs a detection result to decoding circuit 403. Decoding circuit 403 decodes the detection result outputted from sense amplifier 510 to 2-bit data. In addition, decoding circuit 403 decodes the detection result outputted from sense amplifier 511 to 2-bit data.

Through the above-described operation, 4-bit data can be simultaneously read.

The nonvolatile semiconductor memory device in the third embodiment of the present invention can simultaneously write or read 4-bit data. Throughput is thereby improved. Further, since the potential of bit line BL is controlled to be kept ground potential GND using write data so that 4-bit data can be simultaneously written, the write and read circuit can be arranged in a peripheral section outside of the memory cell array. In addition, during data write, the potential of bit line is controlled to be kept ground potential GND using data input/output line pair IO and /IO. As a result, the number of elements in the memory cell array can be decreased.

Fifth Embodiment

In the fourth embodiment of the present invention, the configuration of the write and read circuit in a case of storing 4-bit data in one memory cell has been described. Likewise, the write and read circuit in a case of storing 3-bit data in one memory cell will be described.

Figure 24:
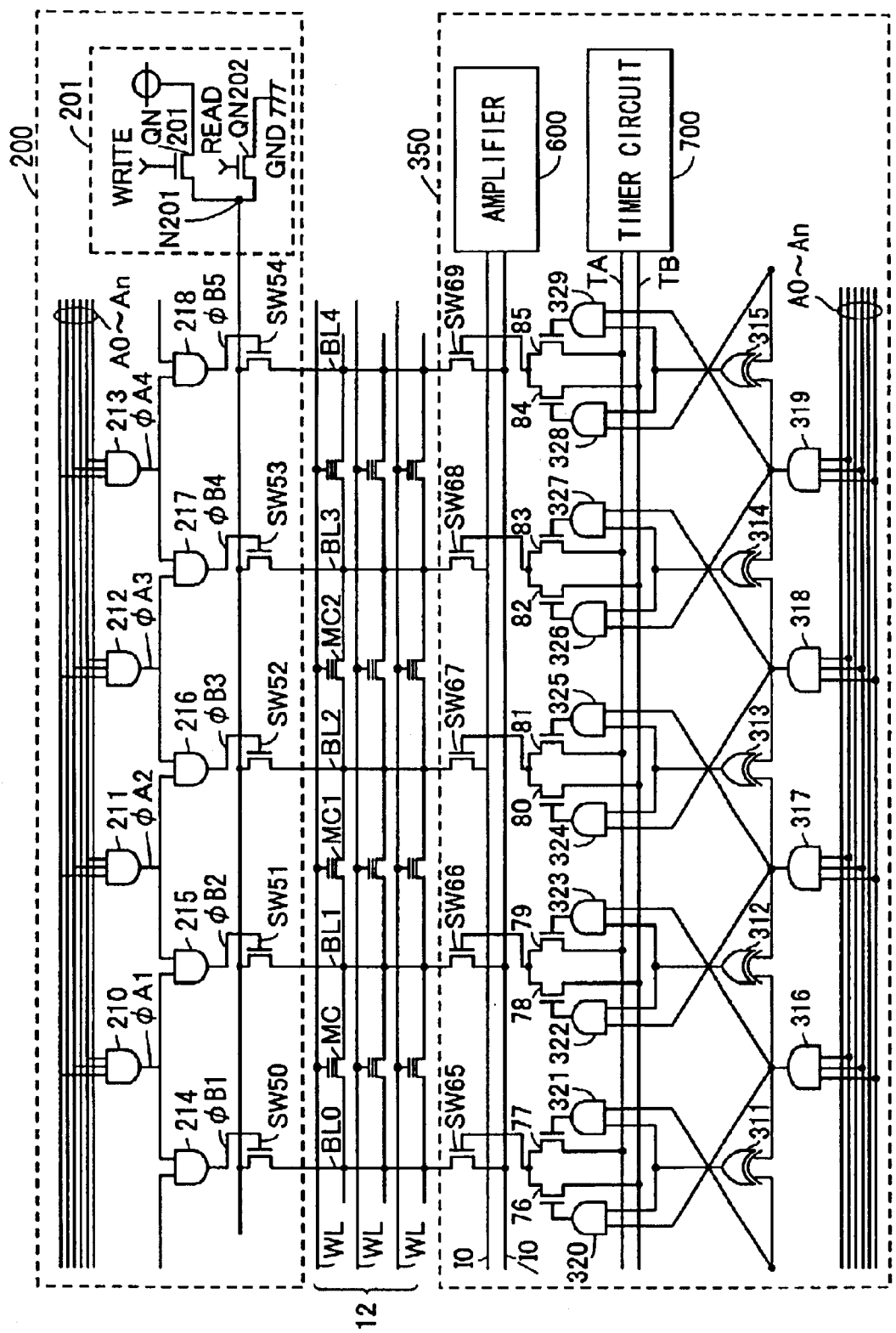
FIG. 24 is a circuit diagram showing the configurations of a write and read circuit and a memory cell array in the fifth embodiment of the present invention.

FIG. 24 is a circuit diagram showing the configurations of a write and read circuit and a memory cell array in the fifth embodiment of the present invention.

Referring to FIG. 24, an amplifier circuit 600 is provided in place of amplifier circuit 400, compared with FIG. 21. In addition, a timer circuit 700 is provided in place of timer circuit 500.

Since the configurations of the other circuits are the same as those shown in FIG. 21, they will not be repeatedly described herein.

Figure 25:
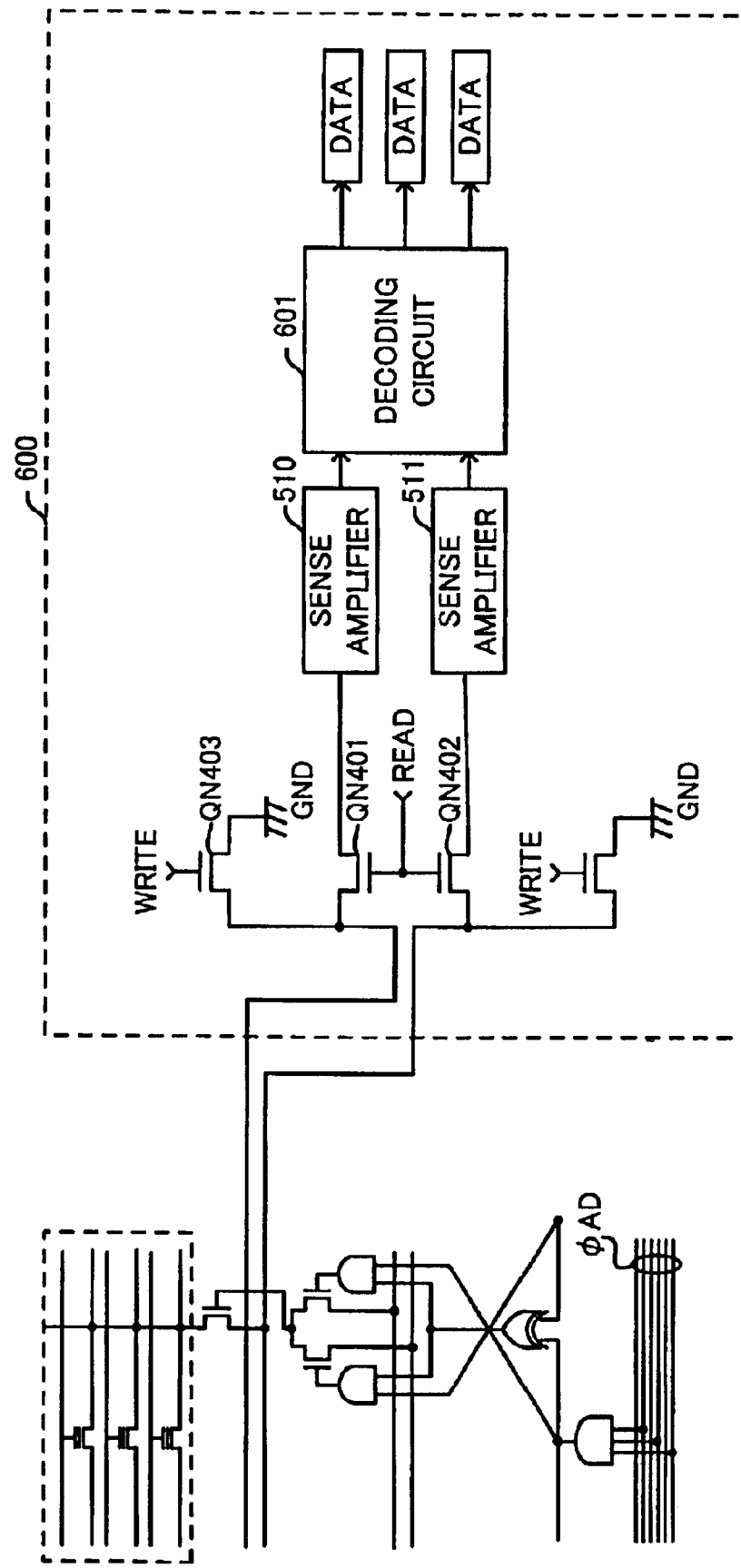
FIG. 25 is a circuit diagram showing the configuration of an amplifier circuit shown in FIG. 24.

FIG. 25 is a circuit diagram showing the configuration of amplifier circuit 600 shown in FIG. 24.

Referring to FIG. 25, amplifier circuit 600 includes a decoding circuit 601 in place of decoding circuit 403 provided in amplifier circuit 400 shown in FIG. 22. The configurations of the other circuits shown in FIG. 25 are the same as those shown in FIG. 22. Decoding circuit 601 output 3-bit data in accordance with the detection result of sense amplifier 510 and that of sense amplifier 511.

Figure 26:
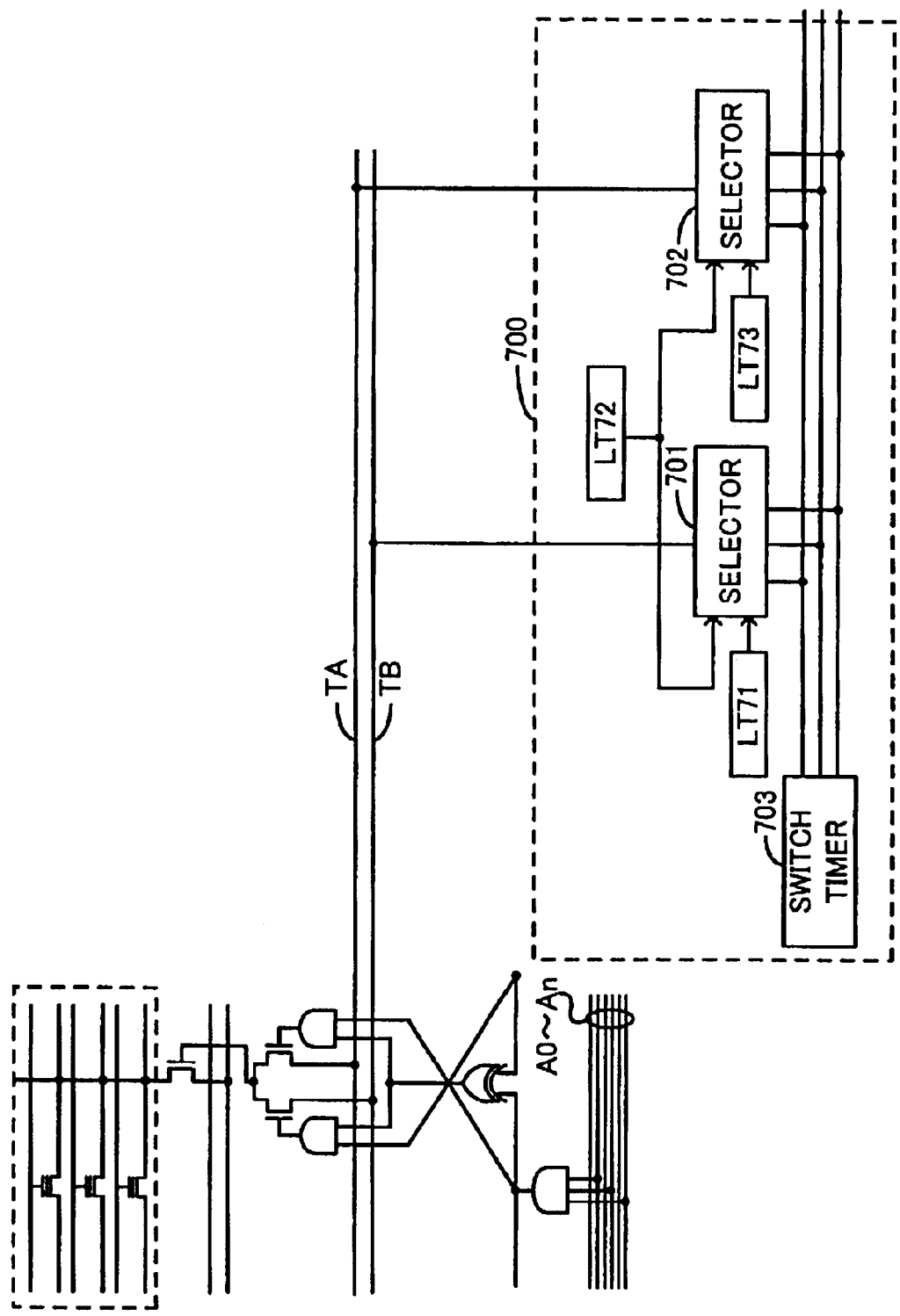
FIG. 26 is a circuit diagram showing the configuration of a timer circuit shown in FIG. 24.

FIG. 26 is a circuit diagram showing the configuration of timer circuit 700 shown in FIG. 24.

Referring to FIG. 26, timer circuit 700 includes selectors 701 and 702, a switch timer 703 and latch circuits LT71 to LT73.

Latch circuits LT71 to LT73 latch data stored in different storage regions of two adjacent memory cells MC, respectively. For example, if storage region L2 of memory cell MC1 and storage region L1 of memory cell MC2 store three pieces of data, respectively, the three pieces of data are latched by latch circuits LT71 to LT73, respectively.

Switch timer 703 outputs three switch signals SS different in H-level period. Selector 701 receives three switch signals SS outputted from switch timer 703, and outputs switch signal SS to signal line TB in accordance with a combination of the data latched by latch circuits LT71 and LT72. Likewise, selector 702 receives three switch signals SS outputted from switch timer 703, and outputs switch signal SS to signal line TA in accordance with a combination of the data latched by latch circuits LT72 and LT73.

Since the operation of the write and read circuit having the above-described circuit configuration is the same as that described in the third embodiment, it will not be repeatedly described herein.

The nonvolatile semiconductor memory device in the fourth embodiment of the present invention can simultaneously write or read 3-bit data. Throughput is thereby improved. In addition, since the write and read circuit can be arranged in a peripheral section outside of the memory cell array, the number of elements in the memory cell array can be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a plurality of word lines arranged in rows;
   a plurality of bit lines arranged in columns;
   a plurality of memory cells each having multiple storage regions for storing data, and arranged in the rows and the columns; and
   a control circuit for selecting a plurality of continuously arranged bit lines among said plurality of bit lines, and supplying a plurality of predetermined potentials corresponding to said plurality of selected bit lines, wherein
      said plurality of memory cells arranged in said rows are connected in series and gates thereof are connected to the word line arranged in the rows thereof, and
      each of said plurality of bit lines is connected to the plurality of memory cells arranged in the two adjacent columns.

2. The nonvolatile semiconductor memory device according to claim 1, wherein
   said control circuit includes:
      a bit line select circuit selecting said plurality of continuously arranged bit lines among said plurality of bit lines; and
      a potential supply circuit supplying said plurality of predetermined potentials corresponding to said plurality of selected bit lines to said plurality of selected bit lines.

3. The nonvolatile semiconductor memory device according to claim 2, wherein
   said bit line select circuit includes:
      a switch signal output circuit receiving an address signal inputted externally and outputting a switch signal; and
      a plurality of switch circuits each connected between the corresponding one of said plurality of bit lines and said potential supply circuit, and turned on when receiving switch signal.

4. The nonvolatile semiconductor memory device according to claim 3, wherein
   said switch signal output circuit includes:
      a signal generation circuit generating said switch signal; and
      a capacitance element connected to said signal generation circuit during a write operation.

5. The nonvolatile semiconductor memory device according to claim 3, wherein
   said potential supply circuit changes the number of the supplied predetermined potentials in accordance with the number of the bit lines selected by said bit line select circuit.

6. The nonvolatile semiconductor memory device according to claim 5, wherein
   said switch signal output circuit outputs said switch signal to two switch circuits.

7. The nonvolatile semiconductor memory device according to claim 6, wherein
   said potential supply circuit supplies a first predetermined potential to one of the selected two bit lines and supplies a second predetermined potential to the other selected bit line.

8. The nonvolatile semiconductor memory device according to claim 5, wherein
   said switch signal output circuit outputs said switch signal to not less than three switch circuits.

9. The nonvolatile semiconductor memory device according to claim 6, wherein
   said potential supply circuit supplies a first predetermined potential to one of the the two bit lines connected to the memory cell for which a write or read operation is performed, supplies a second predetermined potential to the other bit line, and supplies a third predetermined potential to another bit lines among said plurality of selected bit lines.

10. A nonvolatile semiconductor memory device comprising:
    a plurality of word lines arranged in rows;
    a plurality of bit lines arranged in columns;
    a plurality of memory cells each having at least one storage region for storing data, and arranged in the rows and the columns; and
    a write circuit for writing a plurality of data to a plurality of continuously arranged memory cells among a plurality of memory cells arranged in the same row, wherein
       said plurality of memory cells arranged in said rows are connected in series and gates thereof are connected to the word line arranged in the row thereof, and
       each of said plurality of bit lines is connected to the plurality of memory cells arranged in the two adjacent columns.

11. The nonvolatile semiconductor memory device according to claim 10, wherein said write circuit writes data to different storage regions of the adjacent memory cells among said plurality of continuously arranged memory cells.

12. The nonvolatile semiconductor memory device according to claim 11, wherein
said write circuit includes:
a plurality of first switch circuits each connected between the corresponding one of said plurality of bit lines and a first predetermined potential node; and
a plurality of second switch circuits each connected between the corresponding one of said plurality of bit lines and a second predetermined potential node, and
the first and second switch circuits connected to the bit line connected to the memory cell to which no data is written are turned off.

13. The nonvolatile semiconductor memory device according to claim 12, wherein
said write circuit further includes:
a first control circuit turning on each of said plurality of first switch circuits in accordance with an address signal; and
a second control circuit turning on each of said plurality of second switch circuits in accordance with said address signal and said data.

14. The nonvolatile semiconductor memory device according to claim 13, wherein
each of said plurality of memory cells stores a plurality of data with not less than three levels, and
said second control circuit includes:
a switch select circuit selecting a second switch circuit turned on in response to said address signal; and
a time determination circuit determining time for turning on said second switch circuit selected by said switch select circuit, from the plurality of pieces of data written to the different storage regions of the two adjacent memory cells among said plurality of continuously arranged memory cells.

15. The nonvolatile semiconductor memory device according to claim 10, further comprising
a read circuit reading the data written to said plurality of continuously arranged memory cells among said plurality of memory cells arranged in the same row.

16. The nonvolatile semiconductor memory device according to claim 15, wherein
said read circuit reads data from the different storage regions of the two adjacent memory cells among said plurality of continuously arranged memory cells.

17. A nonvolatile semiconductor memory device comprising:
a plurality of word lines arranged in rows;
a plurality of bit lines arranged in columns;
a plurality of memory cells each having at least one storage region for storing data, and arranged in the rows and the columns; and
a write circuit for writing a plurality of data to a plurality of continuously arranged memory cells among a plurality of memory cells arranged in the same row, wherein
said plurality of memory cells arranged in said rows are connected in series and gates thereof are connected to the word line arranged in the row thereof,
each of said plurality of bit lines is connected to a plurality of memory cells arranged in the two adjacent columns, and
each of said plurality of memory cells stores a plurality of data with not less than three levels.

18. The nonvolatile semiconductor memory device according to claim 17, wherein
said write circuit includes a time determination circuit determining write time for writing the data to the two adjacent memory cells in response to the plurality of data written to the different storage regions of said two adjacent memory cells among said plurality of continuously arranged memory cells.

* * * * *

UNITED STATES PATENT AND TRADEMARK OFFICE
CERTIFICATE OF CORRECTION

PATENT NO. : 6,728,134 B2
DATED : April 27, 2004
INVENTOR(S) : Tsukasa Ooishi

It is certified that error appears in the above-identified patent and that said Letters Patent is hereby corrected as shown below:

Column 26,
Line 39, change the dependency from "6" to -- 8 --.

Signed and Sealed this

Twenty-first Day of December, 2004

JON W. DUDAS
*Director of the United States Patent and Trademark Office*